US010355230B2

(12) United States Patent
Zhou et al.

(10) Patent No.: US 10,355,230 B2
(45) Date of Patent: Jul. 16, 2019

(54) RED ORGANIC ELECTROLUMINESCENT DEVICE AND PREPARATION METHOD THEREOF

(71) Applicant: Changchun Institute of Applied, Chemistry Chinese Academy of Sciences, Changchun, Jilin (CN)

(72) Inventors: Liang Zhou, Jilin (CN); Hongjie Zhang, Jilin (CN); Jing Feng, Jilin (CN)

(73) Assignee: Changchung Institute of Applied Chemistry, Chinese Academy of Sciences, Changchung (CN)

(*) Notice: Subject to any disclaimer, the term of this patent is extended or adjusted under 35 U.S.C. 154(b) by 296 days.

(21) Appl. No.: 15/522,581

(22) PCT Filed: Nov. 20, 2014

(86) PCT No.: PCT/CN2014/091779
§ 371 (c)(1),
(2) Date: Apr. 27, 2017

(87) PCT Pub. No.: WO2016/065677
PCT Pub. Date: May 6, 2016

(65) Prior Publication Data
US 2017/0317307 A1    Nov. 2, 2017

(30) Foreign Application Priority Data
Oct. 30, 2014  (CN) .......................... 2014 1 0605638

(51) Int. Cl.
*H01L 51/50*    (2006.01)
*H01L 51/56*    (2006.01)
(Continued)

(52) U.S. Cl.
CPC .......... *H01L 51/5024* (2013.01); *C09K 11/06* (2013.01); *H01L 51/50* (2013.01);
(Continued)

(58) Field of Classification Search
CPC ............. H01L 51/5024; H01L 51/5206; H01L 51/0089; H01L 51/5221; H01L 51/56;
(Continued)

(56) References Cited

U.S. PATENT DOCUMENTS

| | | | |
|---|---|---|---|
| 5,776,622 A | | 7/1998 | Hung et al. |
| 2005/0260439 A1* | | 11/2005 | Shiang ................ H01L 51/0084 428/690 |

(Continued)

FOREIGN PATENT DOCUMENTS

| | | | |
|---|---|---|---|
| CN | 1718668 A | | 1/2006 |
| CN | 1948309 A | | 4/2007 |

(Continued)

OTHER PUBLICATIONS

"International Application No. PCT/CN2014/091779, International Search Report dated Jul. 20, 2015", w/ English Translation, (dated Jul. 20, 2015), 7 pgs.

(Continued)

*Primary Examiner* — Alexander C Kollias
(74) *Attorney, Agent, or Firm* — Schwegman Lundberg & Woessner, P.A.

(57) ABSTRACT

The invention provides a red organic electroluminescent device, composed of a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer arranged in turn, wherein the electron-dominated light-emitting layer is composed of an organic sensitive (Continued)

material, a red organic light-emitting material, and an electron-type organic host material. A rare earth complex having a matched energy level, such as Eu(DBM)$_3$phen or Eu(TTA)$_3$phen is selected as the organic sensitive material, and a trace amount of the same is doped into the electron-dominated light-emitting layer, which has the function of an energy transporting ladder and a deep binding center for charge carriers, so as to improve the light-emitting effectiveness, spectral stability, and service life of the device, reduce the operating voltage of the device, and delay the attenuation of the effectiveness of the device.

11 Claims, 2 Drawing Sheets

(51) Int. Cl.
  *C09K 11/06* (2006.01)
  *H01L 51/52* (2006.01)
  *H01L 51/00* (2006.01)
(52) U.S. Cl.
  CPC ...... *H01L 51/5206* (2013.01); *H01L 51/5221* (2013.01); *H01L 51/56* (2013.01); *C09K 2211/1007* (2013.01); *C09K 2211/1022* (2013.01); *C09K 2211/1029* (2013.01); *C09K 2211/182* (2013.01); *C09K 2211/185* (2013.01); *H01L 51/0008* (2013.01); *H01L 51/008* (2013.01); *H01L 51/0067* (2013.01); *H01L 51/0072* (2013.01); *H01L 51/0085* (2013.01); *H01L 51/0089* (2013.01); *H01L 51/0094* (2013.01); *H01L 51/5016* (2013.01); *H01L 51/5028* (2013.01); *H01L 51/5056* (2013.01); *H01L 51/5072* (2013.01); *H01L 51/5096* (2013.01); *H01L 2251/558* (2013.01)

(58) Field of Classification Search
  CPC . H01L 51/50; H01L 51/5016; H01L 51/0008; H01L 51/0067; H01L 51/0072; H01L 51/008; H01L 51/0085; H01L 51/0094; H01L 51/5028; H01L 51/5056; H01L 51/5072; H01L 51/5096; H01L 2251/558
  See application file for complete search history.

(56) References Cited

U.S. PATENT DOCUMENTS

| | | |
|---|---|---|
| 2007/0185294 A1 | 8/2007 | Park et al. |
| 2009/0167159 A1* | 7/2009 | Song ............... H01L 51/5048 313/504 |
| 2009/0179559 A1* | 7/2009 | Yoon ............... H01L 51/5048 313/504 |
| 2010/0187980 A1* | 7/2010 | Langer ............ C07F 7/0812 313/504 |
| 2011/0127507 A1* | 6/2011 | Choi ............... H01L 21/268 257/40 |

FOREIGN PATENT DOCUMENTS

| | | |
|---|---|---|
| CN | 101384112 A | 3/2009 |
| CN | 102394276 A | 3/2012 |
| CN | 103555318 A | 2/2014 |
| JP | 2000178236 A | 6/2000 |

OTHER PUBLICATIONS

"International Application No. PCT/CN2014/091779, Written Opinion dated Jul. 20, 2015", (dated Jul. 20, 2015), 3 pgs.
"European Application Serial No. 14904828.2, Extended European Search Report dated Jun. 22, 2018", (dated Jun. 22, 2018), 6 pgs.
"XP-002781736", WPI Clarivate Analytics, (2017), 2 pgs.
"XP-002781737", WPI—Clarivate Analytics, (2017), 2 pgs.

* cited by examiner

RED ORGANIC ELECTROLUMINESCENT DEVICE AND PREPARATION METHOD THEREOF

This application is a U.S. National Stage Filing under 35 U.S.C. 371 from International Application No. PCT/CN2014/091779, filed on 20 Nov. 2014, and published as WO2016/065677 on 6 May 2016, which claims the priority of Chinese Patent Application No. 201410605638.8, filed with SIPO on Oct. 30, 2014, entitled "RED ORGANIC ELECTROLUNTINESCENT DEVICE AND PREPARATION METHOD THEREOF"; which applications and publication are incorporated herein by reference in their entirety.

FIELD OF THE INVENTION

This disclosure relates to the technical field of organic electroluminescence, and particularly to a red organic electroluminescent device and the preparation method thereof.

BACKGROUND OF THE INVENTION

An organic electroluminescent device is a device which spontaneously emits light, and the principle of light emission thereof is as follows. When charges are injected into an organic layer between a hole injection electrode and an electron injection electrode, electrons and holes encounter, combined, and then annihilated, and thus light is generated. Organic electroluminescent devices have the characteristics of low voltage, high brightness, wide view angle, or the like. Therefore, organic electroluminescent devices have been rapidly developed in recent years. Among these, the red organic electroluminescent devices have become hot spots of investigation due to the wide prospect for application in terms of monochromatic display, white light modulation, or the like.

Trivalent iridium complexes are considered as ideal organic electroluminescent materials in both the academic world and the industrial world all the time due to the advantages of high light-emitting effectiveness, adjustable color of light emission, or the like.

A number of domestic and foreign research teams have intended to improve the overall properties of the red organic electroluminescent devices by starting with aspects of material synthesis and device optimization so as to meet the requirement for industrialization. For Example, an organic electroluminescent device was prepared by a doping method using an iridium complex btp2Ir (acac) having standard red emission as a light-emitting material by S. R. Forrest et al., at Princeton University, United States, in 2001. Although this device shows a highly ideal red emission, unbalanced injection of carriers leads to relatively low efficiency and brightness of the device, and the operating voltage of the device is relatively high.

In order to solve these problems, an iridium complex $(fbi)_2Ir(acac)$ having a high efficiency was selected as a red dye and was incorporated into a preferred host material to prepare a red organic electroluminescent device having a multilayer structure by Dongge Ma et al., at Changchun Institute of Applied Chemistry, Chinese Academy of Sciences, in 2009. This device has relatively high maximal light-emitting effectiveness and maximal brightness, but the light-emitting effectiveness of the device rapidly attenuates as the current density increases. Furthermore, the complicated structure of the device not only leads to a relatively high cost of production, but is also disadvantageous to the reduction of the operating voltage of the device. A red platinum complex was synthesized as a light-emitting material and a device structure comprising two light-emitting layers were designed and optimized by Zhiming Zhi et al., at The University of Hong Kong, in 2013, and an organic electroluminescent device having a purely red emission was obtained. The efficiency attenuation of this device has been greatly alleviated, but the device still has the problems of relatively high operating voltage and relatively low brightness. As thus can be seen, the overall properties, such as light-emitting effectiveness, brightness, spectral stability, service life, and the like, of the red organic electroluminescent device are still not effectively improved.

SUMMARY OR THE INVENTION

The technical problem to be solved in this disclosure is to provide a red organic electroluminescent device having relatively high overall properties and the preparation method thereof.

In view of this, this application provides a red organic electroluminescent device, comprising:

a substrate;
an anode layer provided on the substrate;
an anode modification layer provided on the anode layer;
a hole transporting-electron blocking layer provided on the anode modification layer;
a hole-dominated light-emitting layer provided on the hole transporting-electron blocking layer:
an electron-dominated light-emitting layer provided on the hole-dominated light-emitting layer;
a hole blocking-electron transporting layer provided on the electron-dominated light-emitting layer;
a cathode modification layer provided on the hole blocking-electron transporting layer; and
a cathode layer provided on the cathode modification layer:

wherein the electron-dominated light-emitting layer is composed of an organic sensitive material, a red organic light-emitting material, and an electron-type organic host material;

the organic sensitive material is one or two selected from tris(dibenzoylmethane)phenanthroline europium and tris(thenoyltrifluoroacetone)phenanthroline europium; and the organic sensitive material is 0.1 wt %-0.5 wt % of the electron-type organic host material.

Preferably, the content of the red organic light-emitting material is 2 wt %-5 wt % of the content of the electron-type organic host material.

Preferably, the red organic light-emitting material is one or more selected from bis(2-phenylquinoline)-(2,2,6,6-tetramethyl-3,5-heptanedionate) iridium, bis(2-benzo[b]-2-thiophenyl-pyridine)acetylacetonate) iridium, tris(1-phenylisoquinoline) iridium, bis(1-phenylisoquinoline)(acetylacetone) iridium, bis[1-(9,9-dimethyl-9H-fluoren-2-yl)-isoquinoline](acetylacetone) iridium, bis[2-(9,9-dimethyl-9H-fluoren-2-yl)-quinoline](acetylacetone) iridium, bis(2-phenylquinoline)(2-(3-tolyl)pyridine) iridium, tris[2-phenyl-4-methylquinoline] iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl)-7-methyl-quinoline](acetylacetone) iridium.

Preferably, the electron-type organic host material is one or more selected from 2,6-bis[3-(9H-9-carbazoyl)phenyl] pyridine, 1,4-bis(triphenylsilyl)benzene, 2,2'-bis(4-(9-carbazoyl)phenyl)biphenyl, tris[2,4,6-trimethyl-3-(3-pyridinyl) phenyl]borane, 1,3,5-tri[(3-pyridinyl)-3-phenyl]benzene, 1,3-bis[3,5-di(3-pyridinyl)phenyl]benzene, 1,3,5-tris(1-phenyl-1H-benzimidazol-2-yl)benzene, 9-(4-tert-butylphenyl)-3,6-bis(triphenylsilyl)-9H-carbazole, and 9-(8-diphenylphosphoryl)-dibenzo[b, d]furan-9H-carbazole.

Preferably, the hole-dominated light-emitting layer is composed of a red organic light-emitting material and a hole-type organic host material; and the red organic light-emitting material is 2.0 wt %-5.0 wt % of the hole-type organic host material, wherein the red organic light-emitting material is one or more selected from bis(2-phenylquinoline)-(2,2,6,6-tetramethyl-3,5-heptanedionate) iridium, bis(2-benzo[b]-2-thiophenyl-pyridine)acetylacetonate) iridium, tris(1-phenylisoquinoline) iridium, bis(1-phenylisoquinoline)(acetylacetone) iridium, bis[1-(9,9-dimethyl-9H-fluoren-2-yl)-isoquinoline] (acetylacetone) iridium, bis[2-(9,9-dimethyl-9H-fluoren-2-yl)-quinoline](acetylacetone) iridium, bis(2-phenylquinoline)(2-(3-tolyl)pyridine) iridium, tris[2-phenyl-4-methylquinoline] iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl)-7-methyl-quinoline](acetylacetone) iridium, and the hole-type organic host material is one or more selected from 4,4'-N,N'-dicarbazole-biphenyl, 1,3-dicarbazol-9-yl-benzene, 9,9'-(5-(triphenylsilyl)-1,3-phenyl)bis-9H-carbazole, 1,3,5-tris(9-carbazoyl)benzene, 4,4',4"-tris(carbazol-9-yl)triphenylamine, and 1,4-bis(triphenylsilyl)biphenyl.

Preferably, the material of the hole transporting-electron blocking layer is one or more selected from 4,4'-cyclohexylidenebis[N,N-bis(4-methylphenyl)aniline], dipyrazino[2,3-f:2,3'-h]quinoxaline-2,3,6,7,10,11-hexacarbonitrile, N4,N4'-di(naphthalene-1-yl)-N4,N4'-bis(4-vinylphenyl)biphenyl-4,4'-diamine, N,N'-bis(3-methylphenyl)-N,N'-bis(phenyl)-2,7-diamino-9,9-spirobifluorene, N,N,N',N'-tetra-(3-methylphenyl)-3-3'-dimethylbenzidine, 2,2'-bis(3-(N,N-di-p-tolylamino)phenyl)biphenyl. N,N'-bis(naphthalen-2-yl)-N,N'-bis(phenyl)benzidine, N,N'-bis(naphthalen-1-yl)-N,N'-diphenyl-2,7-diamino-9,9-spirobifluorene, N,N'-bis(3-methylphenyl)-N,N'-diphenyl-2,7-diamino-9,9-dimethylfluorene, N,N'-bis(naphthalen-1-yl)-N,N'-diphenyl-2,7-diamino-9,9-dimethylfluorene, N,N'-bis(3-methylphenyl)-N,N'-diphenyl-2,7-diamino-9,9-diphenylfluorene, N,N'-bis(naphthalen-1-yl)-N,N'-diphenyl-2,7-diamino-9,9-diphenylfluorene, N,N'-bis(naphthalen-1-yl)-N,N'-diphenyl-2,2'-dimethylbenzidine, 2,2', 7,7'-tetrakis(N,N-diphenylamino)-2,7-diamino-9,9-spirobifluorene, 9,9-bis[4-(N,N-bis-naphthalen-2-yl-amino)phenyl]-9H-fluorene 9,9-[4-(N-naphthalen-1-yl-N-anilino)-phenyl]-9H-fluorene, 2,2'-bis[N,N-bis(4-phenyl)amino]-9,9-spirobifluorene, 2,2'-bis(N,N-phenylamino)-9,9-spirobifluorene, N,N'-diphenyl-N,N'-(1-naphthyl)-1,1'-biphenyl-4,4'-diamine, and 4,4'-bis[N-(p-tolyl)-N-phenyl-amino]diphenyl.

Preferably, the material of the hole blocking-electron transporting layer is one or more selected from tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl]benzene, and 1,3,5-tris(1-phenyl-1H-benzimidazol-2-yl)benzene.

Preferably, the anode modification layer has a thickness of 1-10 nm, the hole transporting-electron blocking layer has a thickness of 30-60 nm, the hole-dominated light-emitting layer has a thickness of 5-20 nm, the electron-dominated light-emitting layer has a thickness of 5-20 nm, the hole blocking-electron transporting layer has a thickness of 30-60 nm, the cathode modification layer has a thickness of 0.8-1.2 nm, and the cathode layer has a thickness of 90-300 nm.

This application further provides a preparation method of a red organic electroluminescent device, comprising the steps of:

etching an anode layer on a substrate, and after drying, evaporation plating an anode modification layer, a hole transporting-electron blocking layer, a hole-dominated light-emitting layer, an electron-dominated light-emitting layer, a hole blocking-electron transporting layer, a cathode modification layer, and a cathode layer in turn on the anode layer, wherein the electron-dominated light-emitting layer is composed of an organic sensitive material, a red organic light-emitting material, and an electron-type organic host material;

the organic sensitive material is one or two selected from tris(dibenzoylmethane)phenanthroline europium and tris(thenoyltrifluoroacetone)phenanthroline europium; and the organic sensitive material is 0.1 wt %-0.5 wt % of the electron-type organic host material.

Preferably, the evaporation plating rate for the anode modification layer is 0.01-0.05 nm/s; the evaporation plating rates for the hole transporting-electron blocking layer, the hole blocking-electron transporting layer and the host materials in the hole-dominated light-emitting layer and the electron-dominated light-emitting layer are 0.05-0.1 nm/s; the evaporation plating rate for the organic sensitized material in the electron-dominated light-emitting layer is 0.00005-0.0005 nm/s; the evaporation plating rates for the red light-emitting materials in the electron-dominated light-emitting layer and the hole-dominated light-emitting layer are 0.001-0.005 nm/s; the evaporation plating rate for the cathode modification layer is 0.005-0.05 nm/s; and the evaporation plating rate for the cathode layer is 0.5-2.0 nm/s.

This application provides a red organic electroluminescent device, comprising: a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer. The light-emitting material of this application is a red light-emitting material. When an electron and a hole are injected into a light-emitting layer respectively, the electron and the hole will encounter and be recombined to generate an exciton. The exciton will transfer the energy to a molecule of the red light-emitting material in the light-emitting layer to excite an electron into the excited state. A red photon will be generated when the electron in the excited state returns to the ground state in a manner of radiative transition, so that the organic electroluminescent device emits red light.

In this application, by adding one or two of tris(dibenzoylmethane)phenanthroline europium and tris(thenoyltrifluoroacetone)phenanthroline europium to the electron-dominated light-emitting layer as an organic sensitive material, the energy level and the triplet energy thereof are allowed to match the energy levels and the triplet energies of the host material and the light-emitting material, so that the organic sensitive material has the function of an energy transporting ladder and a deep binding center for charge carriers in the process of electroluminescence. This not only improves the energy transfer from the host material to the light-emitting material, but also balances the distribution of electrons and holes in the range of light emission. Therefore, the light-emitting effectiveness of the organic electroluminescent device is improved, the spectral stability of the device is improved, the operating voltage of the device is reduced, the efficiency attenuation of the device is delayed, and the service life of the device is improved.

DETAILED DESCRIPTION OF THE INVENTION

Figure 1:
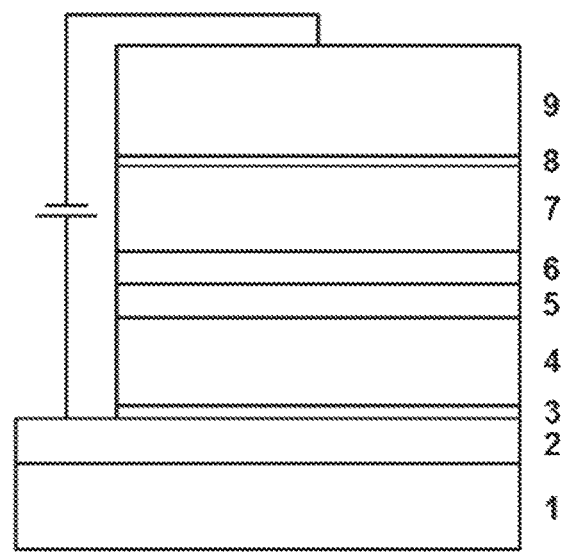
FIG. 1 is a structural schematic diagram of the red organic electroluminescent device of this disclosure.

In order to further understand this disclosure, the preferred embodiments of this disclosure are described below in conjunction with Examples. However, it is to be understood that these descriptions are only used to further illustrate characteristics and advantages of this disclosure, and are not limitations to the claims of this disclosure.

An embodiment of this disclosure discloses a red organic electroluminescent device, comprising:

a substrate;

an anode layer provided on the substrate;

an anode modification layer provided on the anode layer;

a hole transporting-electron blocking layer provided on the anode modification layer;

a hole-dominated light-emitting layer provided on the hole transporting-electron blocking layer;

an electron-dominated light-emitting layer provided on the hole-dominated light-emitting layer;

a hole blocking-electron transporting layer provided on the electron-dominated light-emitting layer;

a cathode modification layer provided on the hole blocking-electron transporting layer; and a cathode layer provided on the cathode modification layer;

wherein the electron-dominated light-emitting layer is composed of an organic sensitive material, a red organic light-emitting material, and an electron-type organic host material;

the organic sensitive material is one or two selected from tris(dibenzoylmethane)phenanthroline europium and tris(thenoyltrifluoroacetone)phenanthroline europium; and the organic sensitive material is 0.1 wt %-0.5 wt % of the electron-type organic host material.

The principle of light emission of an organic electroluminescent device (OLED) is the phenomenon that an electron and a hole injected through electrodes encounter in an organic matter under the driving of an external voltage and the energy is transferred to an organic light-emitting molecule, which is excited to transit from the ground state to the excited state, and light emission is generated by the radiative transition when the excited molecule returns from the excited state to the ground state. This application provides a red organic electroluminescent device, and the reason for the emission of red light is that the light-emitting material used is a red light-emitting material. When an electron and a hole are injected into a light-emitting layer respectively, the electron and the hole will encounter and be recombined to generate an exciton. The exciton transfers the energy to a molecule of the red light-emitting material in the light-emitting layer to excite an electron into the excited state. A red photon will be generated when the electron in the excited state returns to the ground state in a manner of transition, so that the emission of red light of the organic electroluminescent device is achieved.

The red organic electroluminescent device of this application is composed of a substrate, an anode layer, an anode modification layer, a hole transporting-electron blocking layer, a hole-dominated light-emitting layer, an electron-dominated light-emitting layer, a hole blocking-electron transporting layer, a cathode modification layer, and a cathode layer connected in turn. Here, the hole-dominated light-emitting layer and the electron-dominated light-emitting layer are the light-emitting layers of the red organic electronic light-emitting device.

The electron-dominated light-emitting layer of this disclosure is composed of an organic sensitive material, a red organic light-emitting material, and an electron-type organic host material, wherein the organic sensitive material exerts an effect of sensitization in the process of electroluminescence to improve the energy transfer from the host material to the light-emitting material and balance the distribution of electrons and holes in the range of light emission; the molecules of the red organic light-emitting material are dispersed in the electron-dominated light-emitting layer as luminescent centers; and the electron-type organic host material acts as a base material to provide the electron transporting capability. In the electron-dominated light-emitting layer, the energy level and the triplet energy of the organic sensitive material are required to match the energy levels and the triplet energies of the host material and the light-emitting material so as to balance the distribution of electrons and holes the range of light emission and accelerate the energy transfer from the host material to the light-emitting material, so that the red organic electroluminescent device has good overall properties. Therefore, by the selection of the light-emitting material in this application, a rare earth complex is selected as the organic sensitive material. The organic sensitive material is one or two selected from tris(dibenzoylmethane)phenanthroline europium (Eu(DBM)$_3$phen) having the structure of formula (IX) and tris(thenoyltrifluoroacetone)phenanthroline europium (Eu(TTA)$_3$phen) having the structure of formula (X):

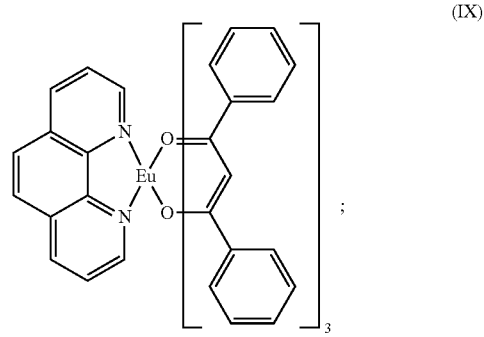

(IX)

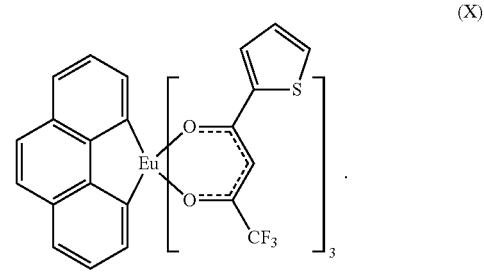

(X)

In this disclosure, the doping concentration of the organic sensitive material in the electron-dominated light-emitting layer influences the properties of the organic electroluminescent device. If the doping concentration of the organic sensitive material is too low, an undesirable effect of sensitization will be caused. If the doping concentration is too high, the overall properties of the organic electroluminescent device will be reduced. Therefore, the organic sensitive material is 0.1 wt %-0.5 wt %, preferably 0.2 wt %-0.3 wt % of the electron-type organic host material.

According to this disclosure, the red organic light-emitting material in the electron-dominated light-emitting layer is a light-emitting material which is well known by the person skilled in the art, and is not particularly limited in this application. However, in order for a better effect of light emission, the red organic light-emitting material is preferably one or more selected from bis(2-phenylquinoline)-(2,2,6,6-tetramethyl-3,5-heptanedionate) iridium (PQ$_2$Ir(dpm)) having the structure of formula (II$_1$), bis(2-benzo[b]-2-thiophenyl-pyridine)(acetylacetonate) iridium (Ir(btp)$_2$(acac)) having the structure of formula (II$_2$), tris(1-phenylisoquinoline) iridium (Ir(piq)$_3$) having the structure of formula (II$_3$), bis(1-phenylisoquinoline)(acetylacetone) iridium (Ir(piq)$_2$(acac)) having the structure of formula (II$_4$), bis[1-(9,9-dimethyl-9H-fluoren-2-yl)-isoquinoline](acetylacetone) iridium (Ir(fliq)$_2$(acac)) having the structure of formula (II$_5$), bis[2-(9,9-dimethyl-9H-fluoren-2-yl)-quinoline](acetylacetone) iridium (Ir(flq)$_2$(acac)) having the structure of formula (II$_6$), bis(2-phenylquinoline)(2-(3-tolyl)pyridine) iridium (Ir(phq)$_2$tpy) having the structure of formula (II$_7$), tris[2-phenyl-4-methylquinoline]iridium (Ir(Mphq)$_3$) having the structure of formula (II$_8$), bis(phenylisoquinoline)(2,2,6,6-tetramethylhexane-3,5-dione) iridium (Ir(dpm)(piq)$_2$) having the structure of formula (II$_9$), bis(2-tnethyl-dibenzo[f,h]quinoxaline)(acetylacetone) iridium (Ir(MDQ)$_2$(acac)) having the structure of formula (II$_{10}$), and bis[2-(2-methylphenyl)-7-methyl-quinoline](acetylacetone) iridium (Ir(dmpq)$_2$(acac)) having the structure of formula (II$_{11}$).

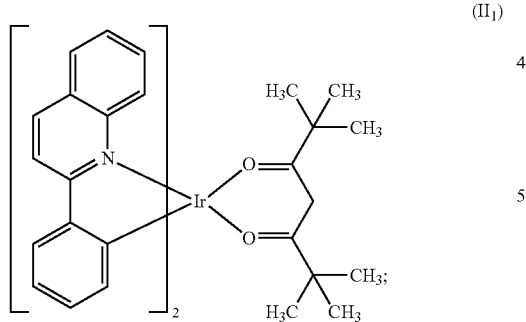

(II$_1$)

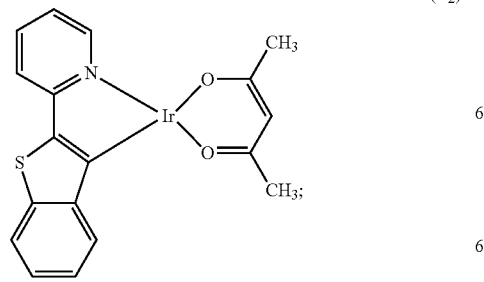

(II$_2$)

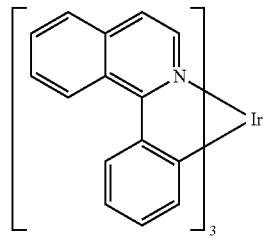

(II$_3$)

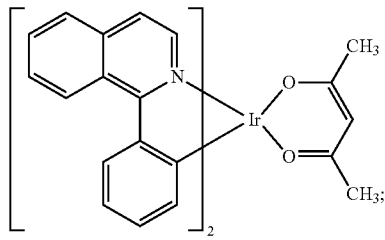

(II$_4$)

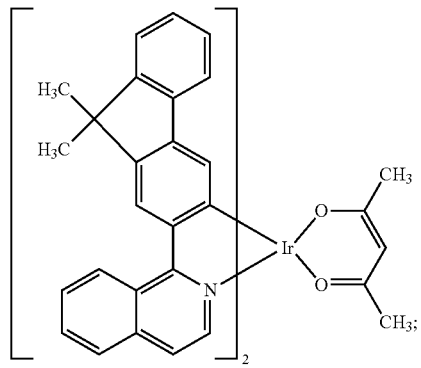

(II$_5$)

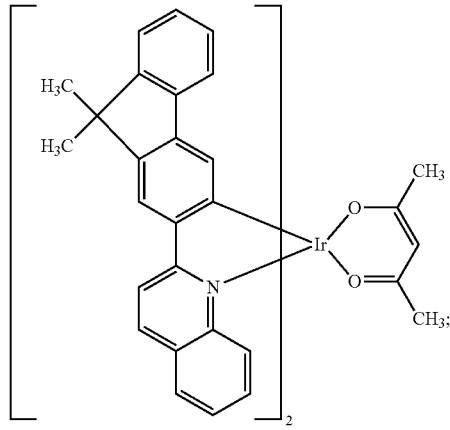

(II$_6$)

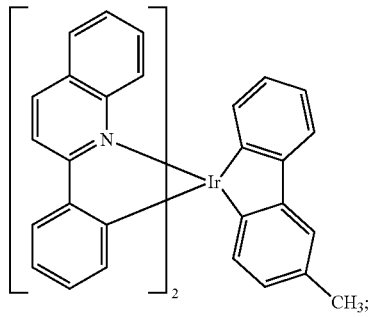

(II$_7$)

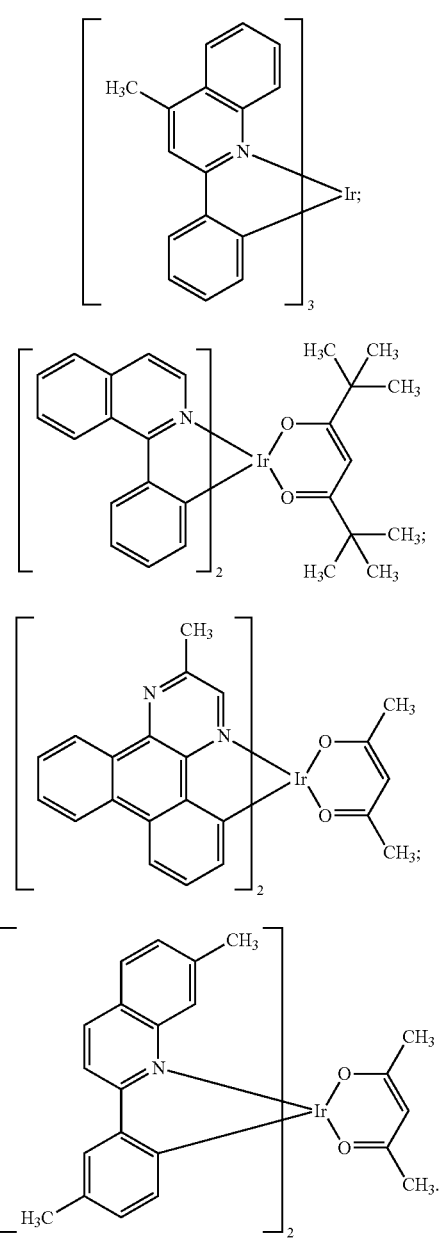

by the person skilled in the art. As a preferred embodiment, the electron-type host material is preferably one or more selected from 2,6-bis[3-(9H-9-carbazoyl)phenyl]pyridine (26DCzPPy) having the structure of formula (XI), 1,4-bis(triphenylsilyl)benzene (UGH2) having the structure of formula (XII), 2,2'-bis(4-(9-carbazoyl)phenyl)biphenyl (BCBP) having the structure of formula (XIII), tris [2,4,6-trimethyl-3-(pyridin-3-yl)phenyl]borane (3TPYMB) having the structure of formula (XIV), 1,3,5-tri[(3-pyridinyl)-3-phenyl]benzene (TmPyPB) having the structure of formula (XV), 1,3-bis[3,5-di(3-pyridinyl)phenyl]benzene (BmPyPhB) having the structure of formula (XVI), 1,3,5-tris(1-phenyl-1H-benzimidazol-2-yl)benzene (TPBi) having the structure of formula (XVII), 9-(4-tert-butylphenyl)-3,6-bis(triphenylsilyl)-9H-carbazole (CzSi) having the structure of formula (XVIII), and 9-(8-diphenylphosphoryl)-dibenzo[b,d]furan-9H-carbazole (DFCzPO) having the structure of formula (XIX):

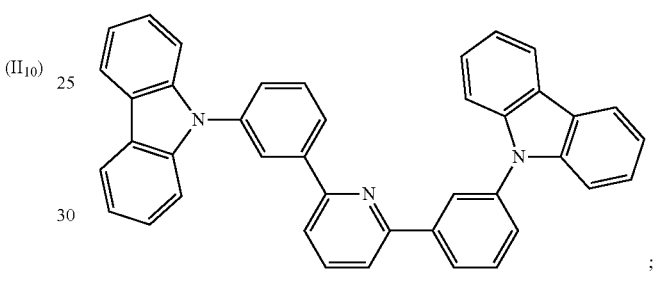

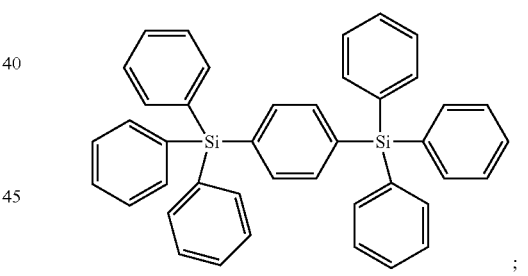

In the electron-dominated light-emitting layer, the doping concentration of the red organic light-emitting material may also influence the overall properties of the red organic electroluminescent device. If the doping concentration of the red organic light-emitting material is too low, relatively low efficiency and undesirable color purity of the device will be caused. If the doping concentration is too high, the agglomeration of molecules of the light-emitting material and the formation of quenching molecules will be caused, and the overall properties of the device are finally reduced. Therefore, the red organic light-emitting material in the electron-dominated light-emitting layer is preferably 2.0 wt %-5.0 wt %, more preferably 2.5 wt %-4.5 wt % of the electron-type organic host material. The electron-type host material in the electron-dominated light-emitting layer acts as a base material to provide the electron transporting capability. The electron-type host material is a material which is well known

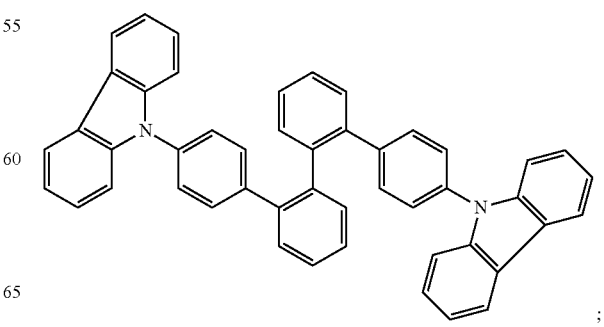

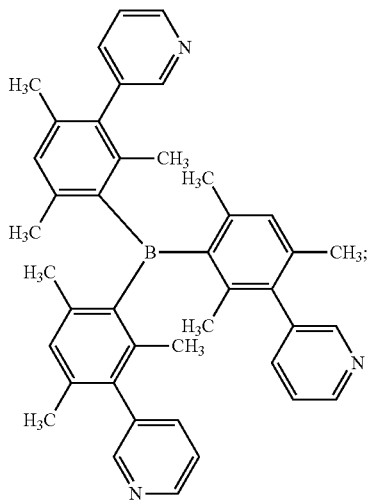

(XIV)

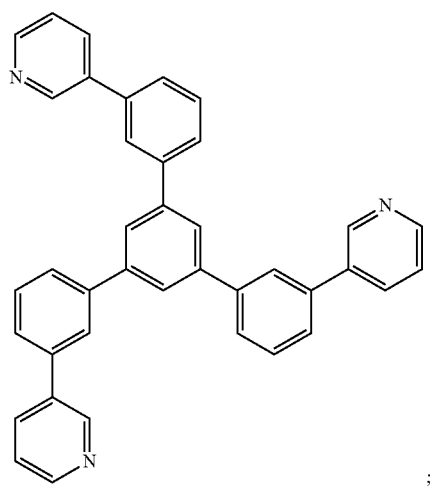

(XV)

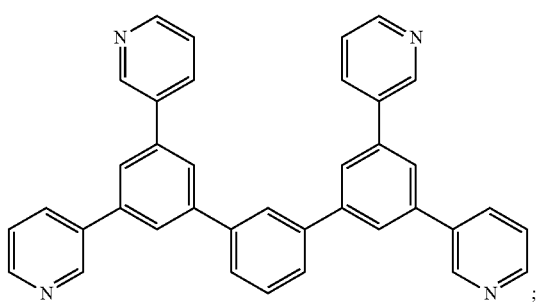

(XVI)

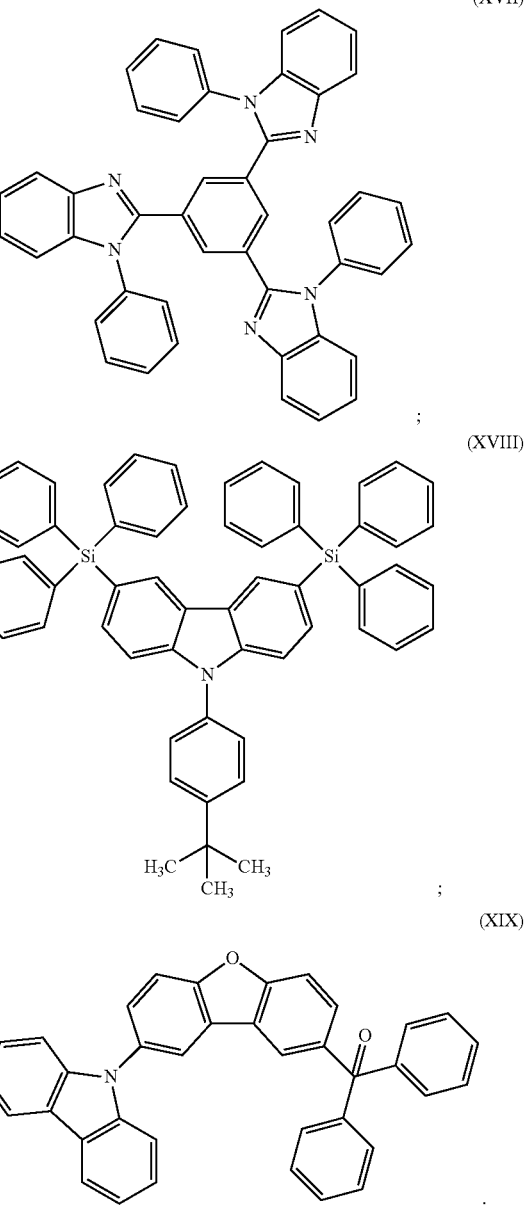

(XVII)

(XVIII)

(XIX)

In this application, the hole-dominated light-emitting layer is composed of a red organic light-emitting material and a hole-type organic host material, wherein the molecules of the red organic light-emitting material are dispersed in the hole-dominated light-emitting layer as luminescent centers. The red organic light-emitting material in the hole-dominated light-emitting layer is 2.0 wt %-5.0 wt %, more preferably 2.5 wt %-4.5 wt % of the hole-type organic host material. If the doping concentration of the red organic light-emitting material is too low, relatively low efficiency and undesirable color purity of the device will be caused. If the doping concentration is too high, the agglomeration of molecules of the light-emitting material and the formation of quenching molecules will be caused, and the overall properties of the device are finally reduced. The hole-type host material acts as a base material to provide the hole transporting capability. In this application, the red organic light-emitting material in the hole-dominated light-emitting layer is preferably one or more selected from bis(2-phenylquinoline)-(2,2,6,6-tetramethyl-3,5-heptanedionate) iridium ($PQ_2Ir(dpm)$) having the structure of formula ($II_1$), bis(2-benzo[b]-2-thiophenyl-pyridine)(acetylacetonate) iridium ($Ir(btp)_2(acac)$) having the structure of formula ($II_2$), tris(1-phenylisoquinoline) iridium ($Ir(piq)_3$) having the structure of formula ($II_3$), bis(1-phenylisoquinoline)(acetylacetone) iridium ($Ir(piq)_2(acac)$) having the structure of formula ($II_4$), bis[1-(9,9-dimethyl-9H-fluoren-2-yl)-isoquinoline](acetylacetone) iridium ($Ir(fliq)_2(acac)$) having the structure of formula ($II_5$), bis[2-(9,9-dimethyl-9H-fluoren-2-yl)-quinoline](acetylacetone) iridium ($Ir(flq)_2(acac)$) having the structure of formula ($II_6$), bis(2-phenylquinoline)(2-(3-tolyl)pyridine) iridium ($Ir(phq)_2tpy$) having the structure of formula ($II_7$), tris[2-phenyl-4-methylquinoline] iridium ($Ir(Mphq)_3$) having the structure of formula ($II_8$), bis(phenylisoquinoline)(2,2,6,6-tetramethylhexane-3,5-dione) iridium ($Ir(dpm)piq)_2$) having the structure of formula ($II_9$), bis(2-methyl-dibenzo[f,h]quinoxaline)(acetylacetone) iridium ($Ir(MDQ)_2(acac)$) having the structure of formula ($II_{10}$), and bis[2-(2-methylphenyl)-7-methyl-quinoline](acetylacetone) iridium ($Ir(dmpq)_2(acac)$) having the structure of formula ($II_{11}$).

the hole-type organic host material is preferably one or more selected from 4,4'-N,N'-dicarbazole-biphenyl (CBP) having the structure of formula (III), 1,3-dicarbazol-9-yl-benzene (mCP) having the structure of formula (IV), 9,9'-(5-(triphenylsilyl)-1,3-phenyl)bis-9H-carbazole (SimCP) having the structure of formula (V), 1,3,5-tris(9-carbazoyl)benzene (TCP) having the structure of formula (VI), 4,4',4"-tris(carbazol-9-yl)triphenylamine (TcTa) having the structure of formula (VII), and 1,4-bis(triphenylsilyl)biphenyl (BSB) having the structure of formula (VIII).

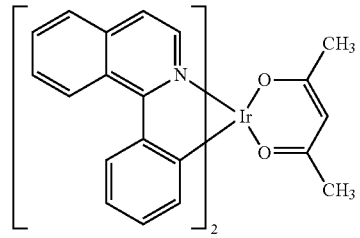

($II_1$)

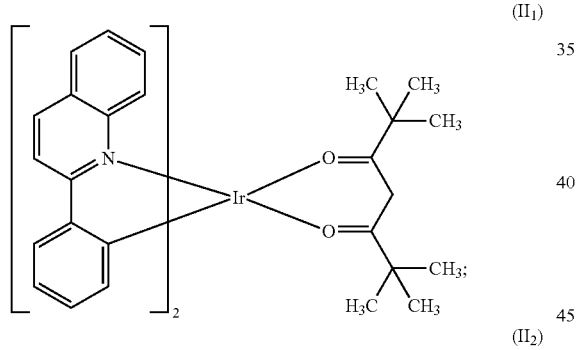

($II_2$)

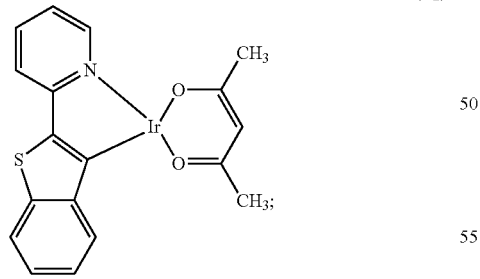

($II_3$)

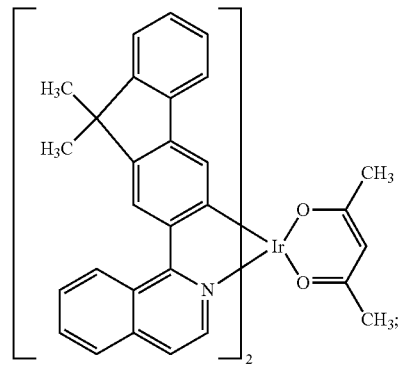

($II_4$)

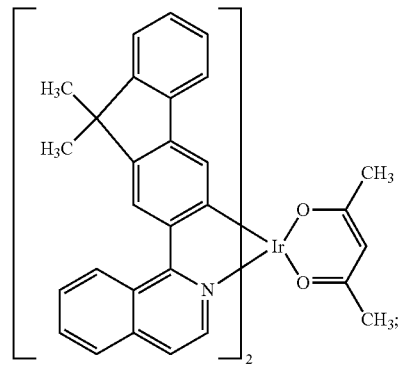

($II_5$)

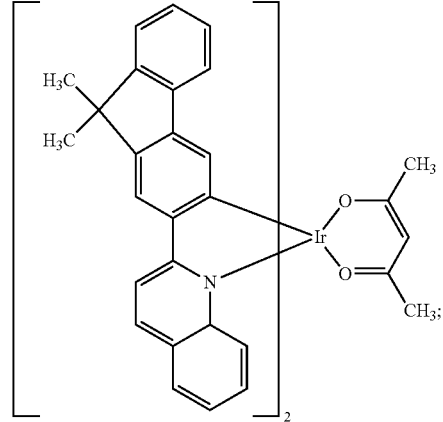

($II_6$)

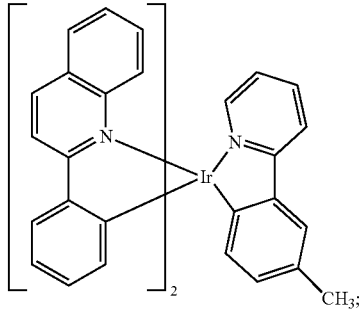

($II_7$)

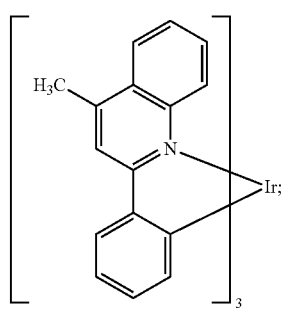
(II₈)
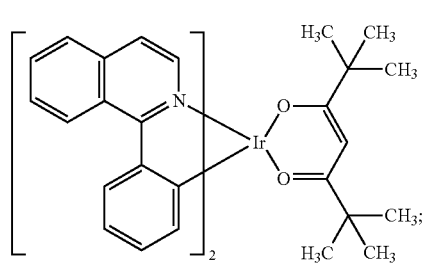
(II₉)
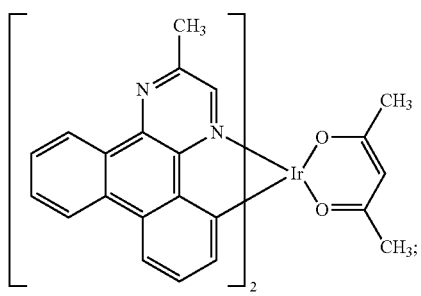
(II₁₀)
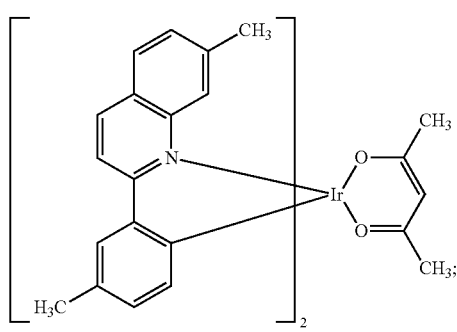
(II₁₁)
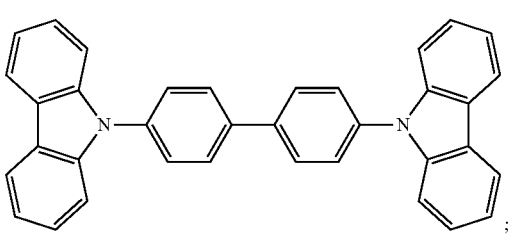
(III)
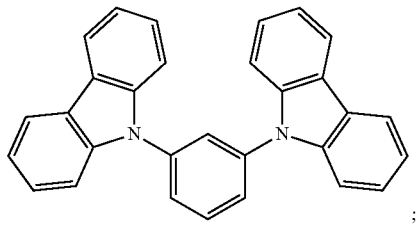
(IV)
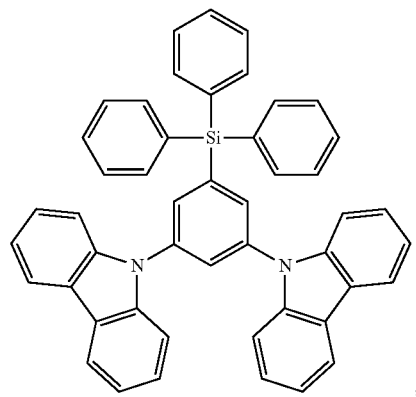
(V)
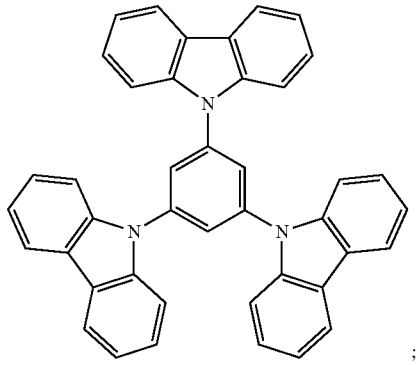
(VI)
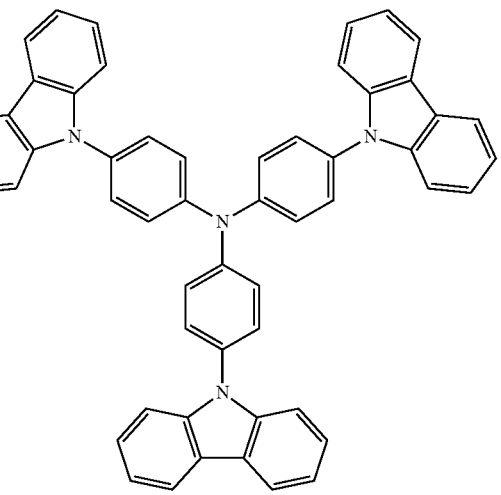
(VII)

-continued (VIII)

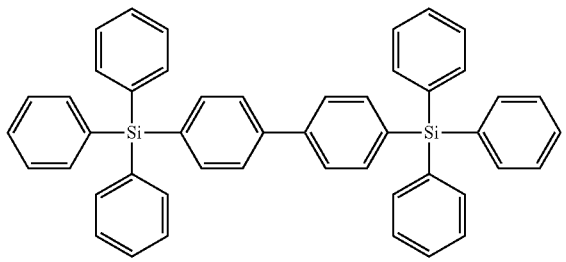

According to this disclosure, in the red organic electroluminescent device, the substrate may be a glass substrate, a quartz substrate, a polycrystalline silicon substrate, a monocrystalline silicon substrate, or a graphene thin-film substrate, and is not particularly limited in this application. The anode layer is preferably selected from indium tin oxide (ITO), which has a surface resistance of preferably 5-25 Ω. The anode modification layer may reduce the drive voltage and accelerate the hole injection. Molybdenum oxide ($MoO_3$) is preferably used the anode modification layer.

In this application, the function of the hole transporting-electron blocking layer is transporting holes and blocking electrons. The material of the hole transporting-electron blocking layer is preferably one or more selected from 4,4'-cyclohexylidenebis[N,N-bis(4-methylphenyl)aniline] (TAPC) having the structure of formula ($II_1$), dipyrazino[2,3-f:2',3'-h]quinoxaline-2,3,6,7,10,11-hexacarbonitrile (HAT-CN) having the structure of formula ($I_2$), N4,N4'-di(naphthalene-1-yl)-N4,N4'-bis(4-vinylphenyl)biphenyl-4,4'-diamine (VNPB) having the structure of formula ($I_3$), N,N'-bis(3-methylphenyl)-N,N'-bis(phenyl)-2,7-diamino-9,9-spirobifluorene (Spiro-TPD) having the structure of formula ($I_4$), N,N,N',N'-tetra-(3-methylphenyl)-3-3'-dimethylbenzidine (HMTPD) having the structure of formula ($I_5$), 2,2'-bis(3-(N,N-di-p-tolylamino)phenyl)biphenyl (3DTAPBP) having the structure of formula ($I_6$), N,N'-bis(naphthalen-2-yl)-N,N'-bis(phenyl)benzidine (β-NPB) having the structure of formula ($I_7$), N,N'-bis(naphthalen-1-yl)-N,N'-diphenyl-2,7-diamino-9,9-spirobifluorene (Spiro-NPB) having the structure of formula ($I_8$), N,N'-bis(3-methylphenyl)-N,N'-diphenyl-2,7-diamino-9,9-dimethylfluorene (DMFL-TPD) having the structure of formula ($I_9$), N,N'-bis(naphthalen-1-yl)-N,N'-diphenyl-2,7-diamino-9,9-imethylfluorene (DMFL-NPB) having the structure of formula ($I_{10}$), N,N'-bis(3-methylphenyl)-N,N'-diphenyl-2,7-diamino-9,9-diphenylfluorene (DPFL-TPD) having the structure of formula ($I_{11}$), N,N'-bis(naphthalen-1-yl)-N,N'-diphenyl-2,7-diamino-9,9-diphenylfluorene (DPFL-NPB) having the structure of formula ($II_2$), N,N'-bis(naphthalen-1-yl)-N,N'-diphenyl-2,2'-dimethylbenzidine (α-NPD) having the structure of formula ($I_{13}$), 2,2',7,7'-tetrakis(N,N-diphenylamino)-2,7-diamino-9,9-spirobifluorene (Spiro-TAD) having the structure of formula ($I_{14}$), 9,9-bis[4-(N,N-bis-naphthalen-2-yl-amino)phenyl]-9H-fluorene (NPAPF) having the structure of formula ($I_{15}$), 9,9-[4-(N-naphthalen-1-yl-N-anilino)-phenyl]-9H-fluorene (NPBAPF) having the structure of formula ($I_{16}$), 2,2'-bis[N,N-bis(4-phenyl)amino]-9,9-spirobifluorene (2,2'-Spiro-DBP) having the structure of formula ($II_{17}$), 2,2'-bis(N,N-phenylamino)-9,9-spirobifluorene (Spiro-BPA) having the structure of formula ($I_{18}$), N,N'-diphenyl-N,N'-(1-naphthyl)-1,1'-biphenyl-4,4'-diamine (NPB) having the structure of formula ($I_{19}$), and 4,4'-bis[N-(p-tolyl)-N-phenyl-amino]diphenyl (TPD) having the structure of formula ($I_{20}$).

($I_1$)

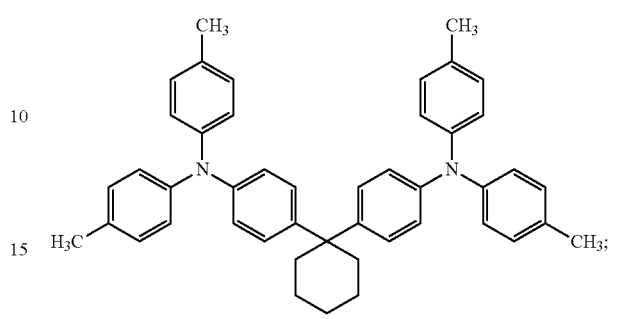

($I_2$)

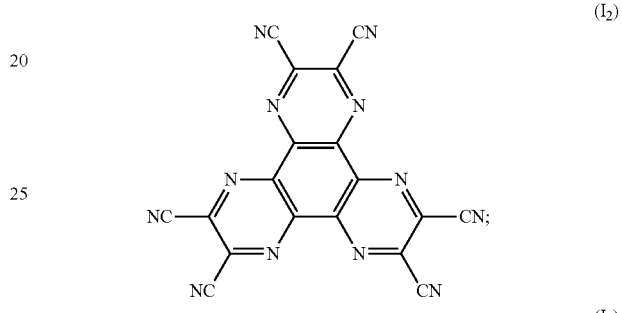

($I_3$)

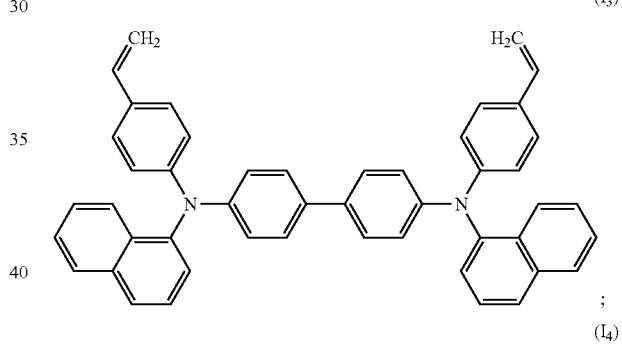

($I_4$)

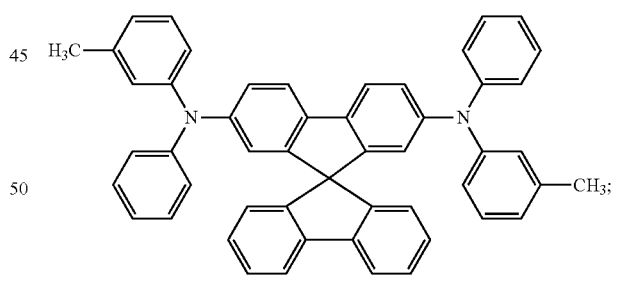

($I_5$)

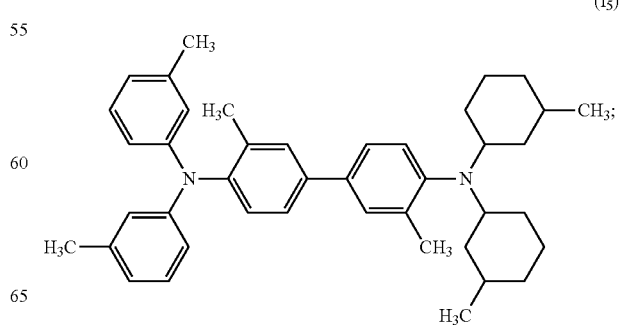

(I6)
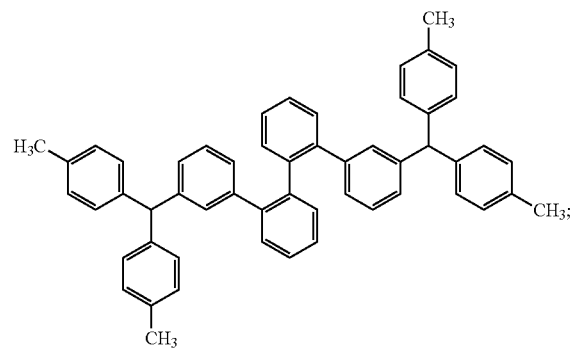
(I7)
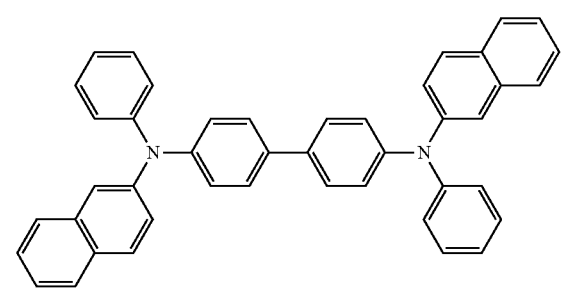
;
(I8)
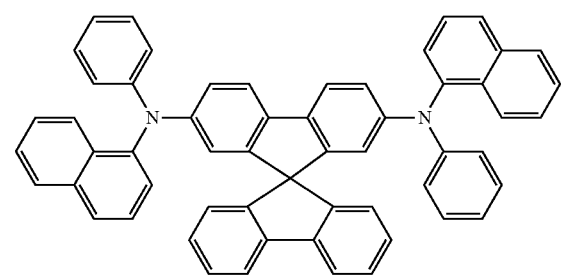
;
(I9)
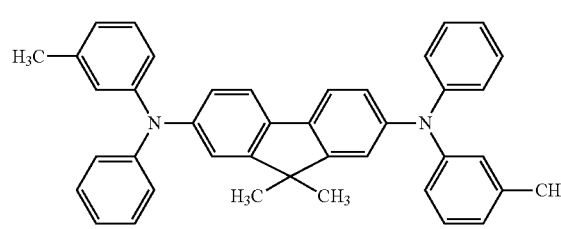
;
(I10)
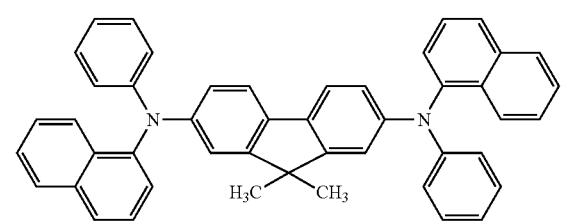
;
(I11)
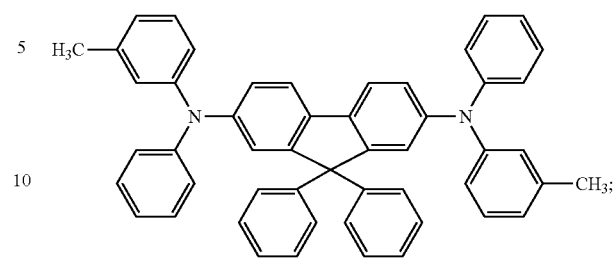
(I12)
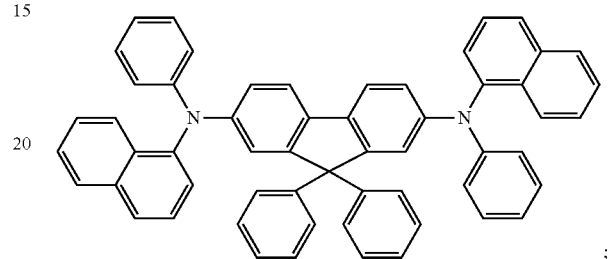
;
(I13)
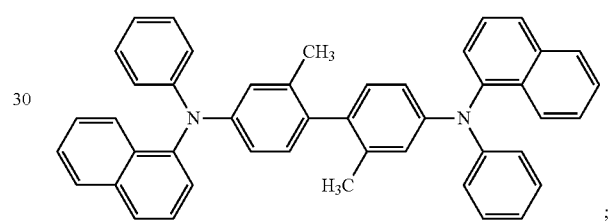
;
(I14)
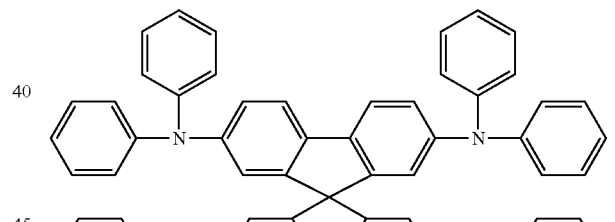
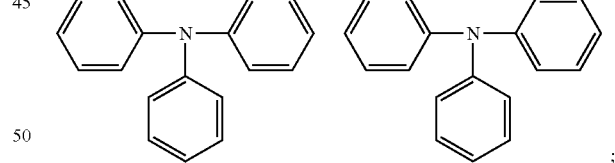
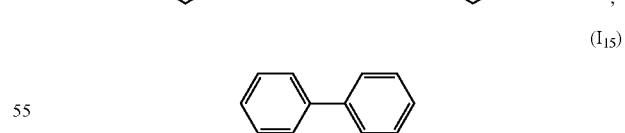
;
(I15)
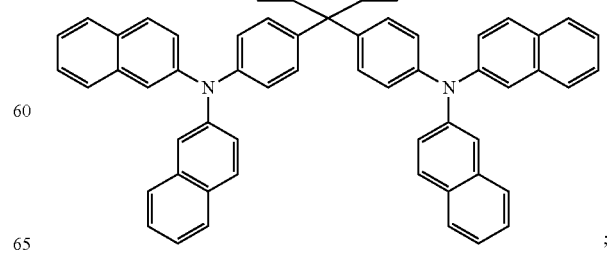
;

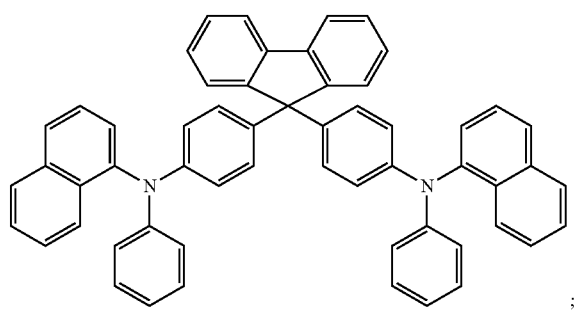
(I₁₆)

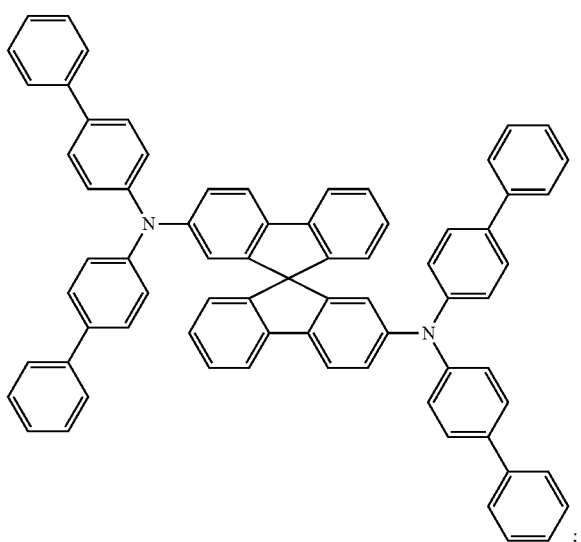
(I₁₇)

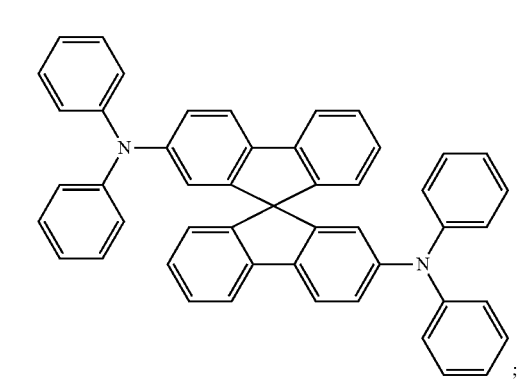
(I₁₈)

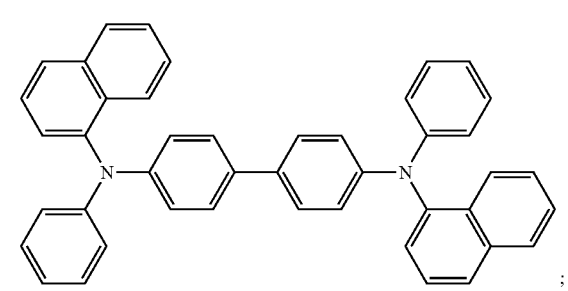
(I₁₉)

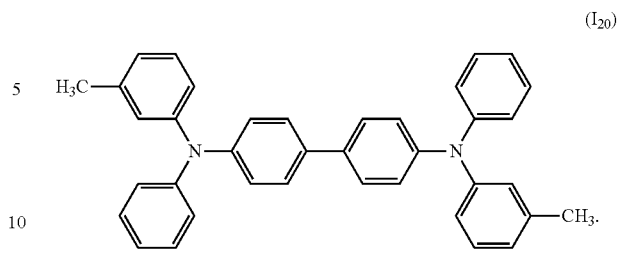
(I₂₀)

According to this disclosure, the function of the hole blocking-electron transporting layer is blocking holes and transporting electrons to promote the electron injection. The material of the hole blocking-electron transporting layer is preferably one or more selected from tris[2,4,6-trimethyl-3-(3-pyridinyl)phenyl]borane (3TPYMB) having the structure of formula (XIV), 1,3,5-tri[(3-pyridinyl)-3-phenyl]benzene (TmPyMB) having the structure of formula (XV), 1,3-bis[3,5-di(3-pyridinyl)phenyl]benzene (BmPyPhB) having the structure of formula (XVI), and 1,3,5-tris(1-phenyl-1H-benzimidazol-2-yl)benzene (TPBi) having the structure of formula (XVII):

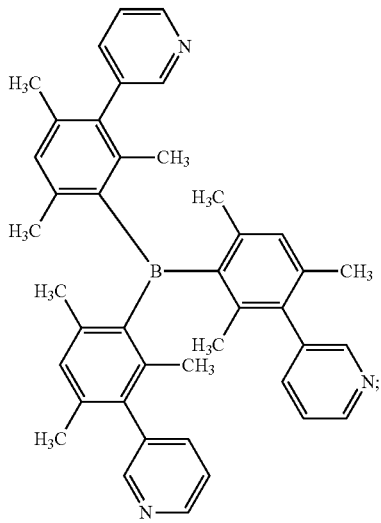
(XIV)

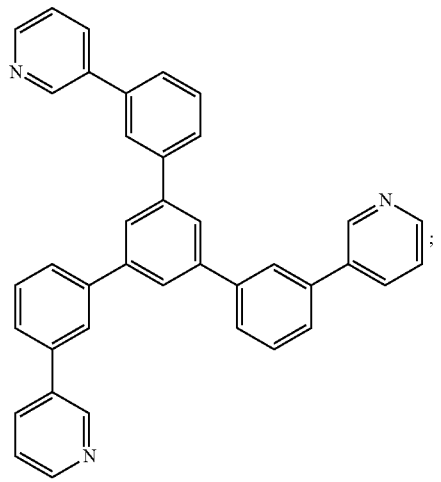
(XV)

-continued

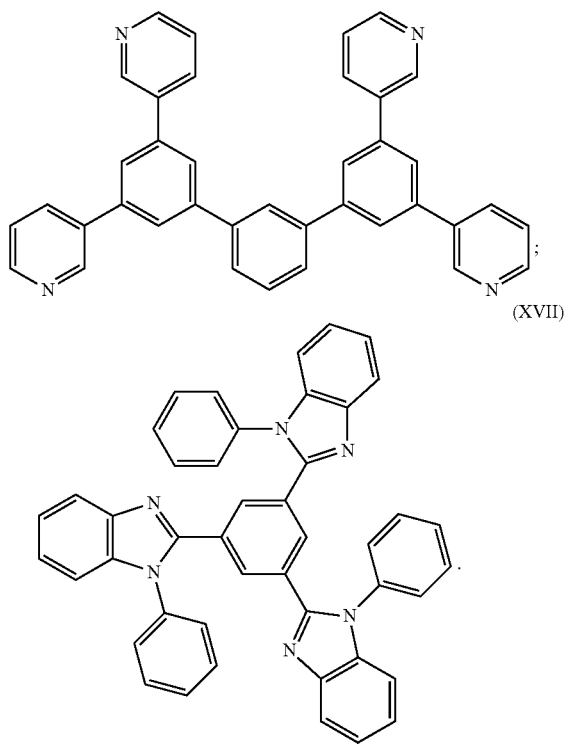

(XVI)

(XVII)

In this application, the function of the cathode modification layer is reducing the drive voltage and accelerating the electron injection. The cathode modification layer is preferably lithium fluoride. The cathode layer is preferably aluminum.

In this application, none of the sources of the material of the hole transporting-electron blocking layer, the red organic light-emitting material, the hole-type organic host material, the organic sensitive material, the electron-type organic host material, and the material of the hole blocking-electron transporting layer is particularly limited, and they may be obtained by the preparation in a manner well known by the person skilled in the art.

In this application, the anode layer and the cathode layer are crossed with each other to form a light-emitting zone. The thickness of each layer in the red organic electroluminescent device of this application has a significant effect on the device. If the thickness is too low, it will result in faster efficiency attenuation of the device. If the thickness is too high, it will result in high operating voltage and short service life of the device. Therefore, the thickness of the anode modification layer is preferably 1-10 nm, the thickness of the hole transporting-electron blocking layer is preferably 30-60 nm, the thickness of the hole-dominated light-emitting layer is preferably 5-20 nm, the thickness of the electron-dominated light-emitting layer is preferably 5-20 nm, the thickness of the hole blocking-electron transporting layer is preferably 30-60 nm, the thickness of the cathode modification layer is preferably 0.8-1.2 nm, and the thickness of the cathode layer is preferably 90-300 nm.

This application further provides a preparation method of the red organic electroluminescent device, comprising the steps of:

etching an anode layer on a substrate, and after drying, evaporation plating an anode modification layer, a hole transporting-electron blocking layer, a hole-dominated light-emitting layer, an electron-dominated light-emitting layer, a hole blocking-electron transporting layer, a cathode modification layer, and a cathode layer in turn on the anode layer, wherein the hole-dominated light-emitting layer is composed of a red organic light-emitting material and a hole-type organic host material; and wherein the electron-dominated light-emitting layer is composed of an organic sensitive material, a red organic light-emitting material, and an electron-type organic host material;

the organic sensitive material is one or two selected from tris(dibenzoylmethane)phenanthroline europium having the structure of formula (IX) and tris(thenoyltrifluoroacetone) phenanthroline europium having the structure of formula (X); and the organic sensitive material is 0.1 wt %-0.5 wt % of the electron-type organic host material:

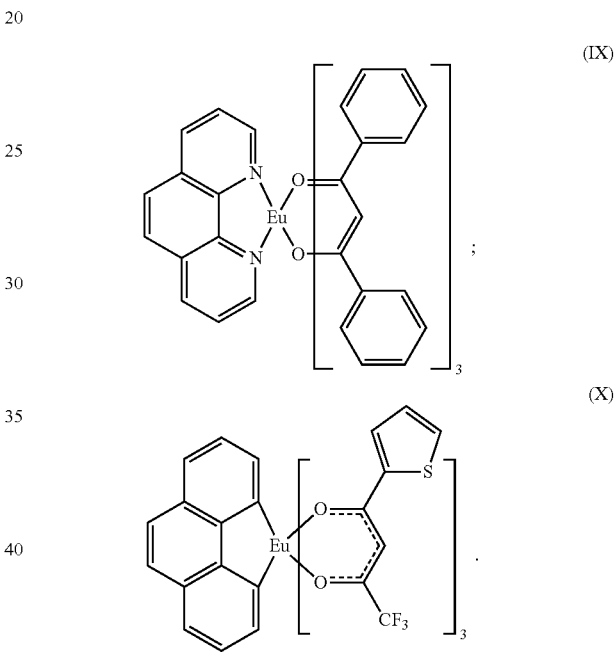

(IX)

(X)

According to this disclosure, the preparation method of the red organic electroluminescent device is specifically as follows:

An anode layer on a substrate is firstly laser-etched into a strip electrode, then ultrasonically cleaned sequentially with a cleaning liquid and deionized water for 10-20 min, and placed in an oven for drying;

the dried substrate is placed in a pretreated vacuum chamber, subjected to low-pressure plasma treatment for 1-10 min under an atmosphere of 8-15 Pa with a voltage of 350-500V, and then transferred to an organic evaporation plating chamber;

an anode modification layer, a hole transporting-electron blocking layer, a hole-dominated light-emitting layer, an electron-dominated light-emitting layer, and a hole blocking-electron transporting layer are sequentially evaporation plated on the anode layer when the vacuum degree reaches $1$-$2\times10^{-5}$ Pa; and the uncompleted device is transferred to a metal evaporation plating chamber, and a cathode modification layer and a metal cathode layer are sequentially evaporation plated under a vacuum atmosphere of $4$-$6\times10^{-5}$ Pa.

In the process of preparing the red organic electroluminescent device, this application achieves the deposition of the material by controlling the evaporation plating rate. According to this disclosure, the evaporation plating rate for the anode modification layer is controlled at 0.01-0.05 nm/s; the evaporation plating rates for the hole transporting-electron blocking layer, the hole blocking-electron transporting layer, and the host materials the hole-dominated light-emitting layer and the electron-dominated light-emitting layer are controlled at 0.05-0.1 nm/s; the evaporation plating rate for the organic sensitive material is controlled at 0.00005-0.0005 nm/s; the evaporation plating rate for the red organic light-emitting material is controlled at 0.001-0.005 nm/s; the evaporation plating rate for the cathode modification layer is controlled at 0.005-0.015 nm/s; and the evaporation plating rate for the metal cathode layer is controlled at 0.5-2.0 nm/s. Here, when the hole-dominated light-emitting layer is evaporation plated, wherein the red organic light-emitting material and the hole-type organic host material are evaporation plated in different evaporating sources at the same time, the weight ratio of the doped red organic light-emitting material to the hole-type organic host material is allowed to be controlled between 2.0%-5.0% by regulating the evaporation plating rates of these two materials. When the electron-dominated light-emitting layer is evaporation plated, wherein the organic sensitive material, the red organic light-emitting material, and the electron-type organic host material are evaporation plated in different evaporating sources at the same time, and the mass ratio of the doped organic sensitive material and the electron-type organic host material is allowed to be controlled between 0.1%-0.5% and the mass ratio of the doped red organic light-emitting material to the electron-type organic host material is allowed to be controlled between 2.0%-5.0% by regulating the evaporation plating rates of these three materials.

This application provides a red organic electroluminescent device. In the electron-dominated light-emitting layer of the red organic electroluminescent device, a rare earth complex having a matched energy level distribution, for Example Eu(DBM)$_3$phen or Eu(TTA)$_3$phen, is selected as the organic sensitive material, which has the function of a deep binding center for charge carriers. This is advantageous to balance the distribution of carriers and widen the range of light emission of the device, so that the light-emitting effectiveness of the device is improved, the operating voltage of the device is reduced, the efficiency attenuation of the device is delayed, and the service life of the device is improved. Furthermore, the organic sensitive material has a matched triplet energy, which has the function of an energy transfer ladder. This can accelerate the energy transfer from the host material to the light-emitting material and alleviate the problem of light emission of the host material caused by insufficient capability of carrier capture of the light-emitting material. Therefore, the spectral stability of the device is improved, and the dependence of the properties of the device on the doping concentration of the light-emitting material is reduced.

In order to further understand this disclosure, the red organic electroluminescent device and the preparation method thereof provided by this disclosure are described in detail below in conjunction with Examples. The protection scope of this disclosure is not limited by the following Examples.

As shown in FIG. 1, FIG.1 is a structural schematic diagram of the red organic electroluminescent device of this disclosure, wherein 1 is a glass substrate, 2 is an anode layer, 3 is an anode modification layer, 4 is a hole transporting-electron blocking layer, 5 is a hole-dominated light-emitting layer, 6 is an electron-dominated light-emitting layer, 7 is a hole blocking-electron transporting layer, 8 is a cathode modification layer, and 9 is a metal cathode layer.

EXAMPLE 1

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1-2\times10^{-5}$ Pa, a MoO$_3$ anode modification layer 3 having a thickness of 3 nm, a TAPC hole transporting-electron blocking layer 4 having a thickness of 40 nm, a TcTa hole-dominated light-emitting layer 5 doped with PQ$_2$Ir(dpm) having a thickness of 10 nm, a CzSi electron-dominated light-emitting layer 6 co-doped with Tb(acac)$_3$phen and PQ$_2$Ir(dpm) having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of $4-6\times10^{-5}$ Pa. Finally, a metal Al cathode layer 9 having a thickness of 120 nm was evaporated on the LiF layer through a specially-made mask plate to prepare an organic electroluminescent device having a structure of ITO/MoO$_3$/TAPC/PQ$_2$Ir(dpm)(4%):TcTa/Eu(TTA)$_3$phen(0.2%):PQ$_2$Ir(dpm)(4%):CzSi/TmPyPB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for PQ$_2$Ir(dpm) and TcTa in the hole-dominated light-emitting layer 5 were controlled at 0.002 nm/s and 0.05 nm/s respectively, the evaporation plating rates for Eu(TTA)$_3$phen, PQ$_2$Ir(dpm), and CzSi in the electron-dominated light-emitting layer 6 were controlled at 0.0001 nm/s, 0.002 nm/s, and 0.05 nm/s respectively, the evaporation plating rate for TmPyPB in the hole blocking-electron transporting layer 7 was controlled at 0.05 nm/s, the evaporation plating rate for LiF in the cathode modification layer 8 was controlled at 0.005 nm/s, and the evaporation plating rate for Al in the metal cathode layer 9 was controlled at 1.0 nm's.

Figure 2:
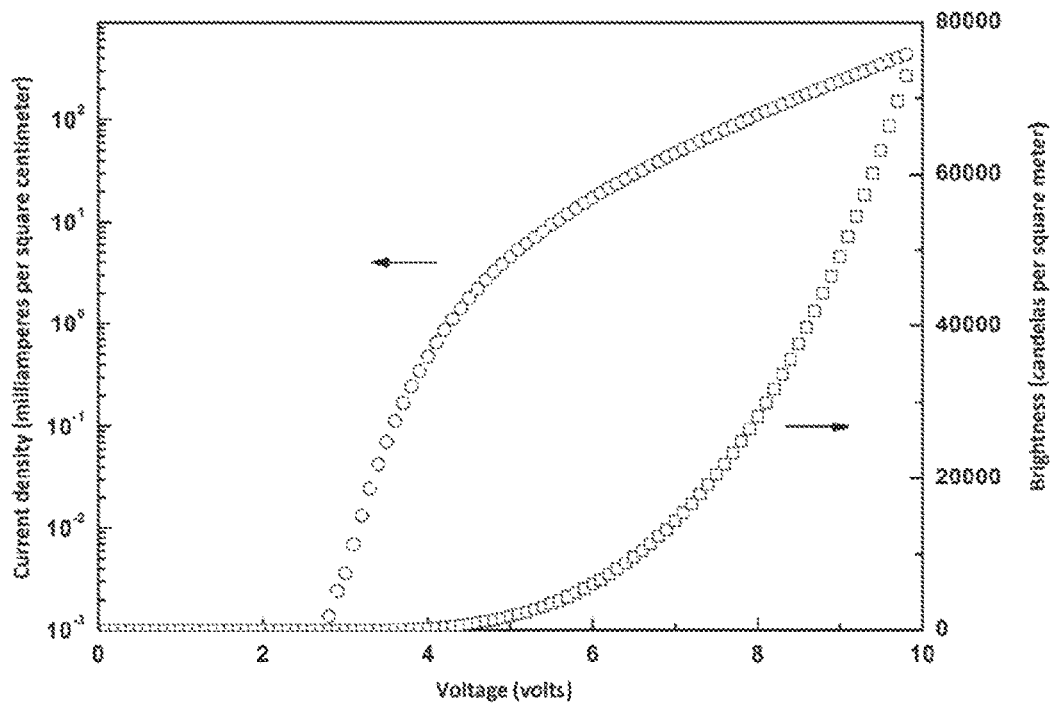
FIG. 2 is a plot of the characteristics of voltage-current density-brightness of the red organic electroluminescent device prepared in Example 1 of this disclosure.

As shown in FIG. 2, FIG. 2 shows the curves of characteristics of voltage-current density-brightness of the red organic electroluminescent device prepared in this Example. In FIG. 2, the ○ curve was a current density-voltage curve of the device, and the □ curve was a brightness-voltage curve of the device. It can be known from FIG. 2 that the brightness of the device increased as the current density and the drive voltage increased, the turn-on voltage of the device was 2.9 volts, and the maximal brightness of 72933 candelas per square meter (cd/m$^2$) of the device was obtained when the voltage was 9.8 volts and the current density was 438.91 milliamperes per square centimeter (mA/cm$^2$).

Figure 3:
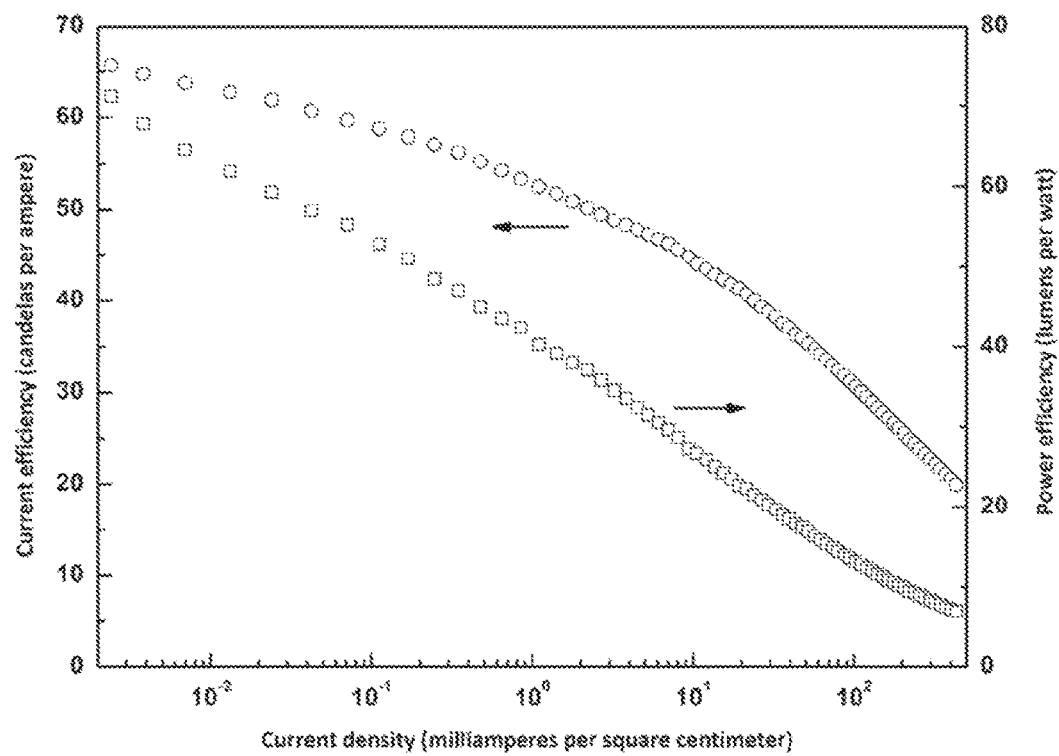
FIG. 3 is a plot of the characteristics of current density-power efficiency-current efficiency of the red organic electroluminescent device prepared in Example 1 of this disclosure.

As shown in FIG. 3, FIG. 3 shows the curves of characteristics of current density-power efficiency-current efficiency of the red organic electroluminescent device prepared in this Example. It can be known from FIG. 3 that the maximal current efficiency of the device was 65.73 cd % A and the maximal power efficiency was 71.17 lm/W.

Figure 4:
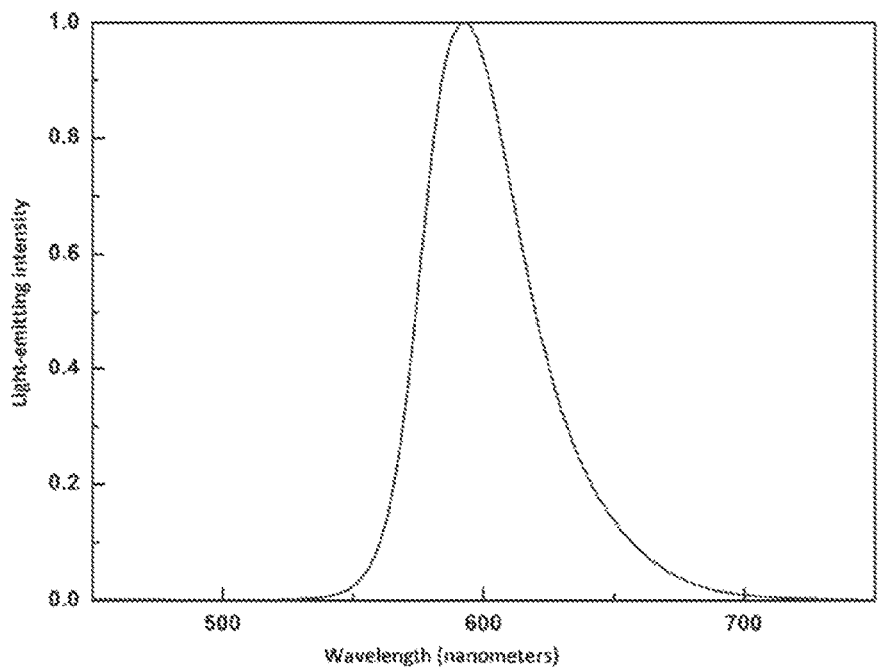
FIG. 4 is a spectrogram of the red organic electroluminescent device prepared in Example 1 of this disclosure when the brightness is 20000 cd/m$^2$.

As shown in FIG. 4, FIG. 4 shows a spectrogram of the red organic electroluminescent device provided by this disclosure when the brightness was 20000 cd/m$^2$. It can be known from FIG. 4 that the main peak of the spectrum was located at 592 nanometers. The color coordinate of the device was (0.592, 0.377).

EXAMPLE 2

An ITO anode layer on an ITO glass was laser-etched into a strip electrode, then ultrasonically cleaned sequentially with a cleaning liquid and deionized water for 15 min. and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 3 nm, a TAPC hole transporting-electron blocking layer 4 having a thickness of 40 nm, a mCP hole-dominated light-emitting layer doped with PQ$_2$Ir(dpm) 5 having a thickness of 10 nm, a 26DCzPPy electron-dominated light-emitting layer 6 co-doped with Eu(TTA)$_3$phen and PQ$_2$Ir(dpm) having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of 4-6×10$^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/PQ$_2$Ir(dpm)(4%):mCP/Eu(TTA)$_3$phen(0.2%):PQ$_2$Ir(dpm)(4%):26DCzPPy/TmPyPB/LiF/Al. The evaporation plating rate for MoO$_3$ in the anode modification layer 3 was controlled at 0.01 nm/s, the evaporation plating rate of TAPC in the hole transporting-electron blocking layer 4 was controlled at 0.05 nm's, the evaporation plating rates for PQ$_2$Ir(dpm) and mCP in the hole-dominated light-emitting layer 5 were controlled at 0.002 nm/s and 0.05 nm/s respectively, the evaporation plating rates for Eu(TTA)$_3$phen, PQ$_2$Ir(dpm), and 26DCzPPy in the electron-dominated light-emitting layer 6 were controlled at 0.0001 nm/s, 0.002 nm/s, and 0.05 nm/s respectively, the evaporation plating rate for TmPyPB in the hole blocking-electron transporting layer 7 was controlled at 0.05 nm/s, the evaporation plating rate for LiF in the cathode modification layer 8 was controlled at 0.005 nm/s, and the evaporation plating rate for Al in the metal cathode layer 9 was controlled at 1.0 nm/s.

The properties of the red organic electroluminescent device prepared in this example were tested. It was demonstrated by experimental results that the device emitted red light at about 592 nanometers under the driving of a direct-current power supply. When the brightness was 20000 cd/m$^2$, the color coordinate of the device was (0.596, 0.378); and the color coordinate of the device was hardly changed as the operating voltage varied. The turn-on voltage of the device was 3.0 volts, and the maximal brightness of the device was 70528 cd/m$^2$. The maximal current efficiency of the device was 64.92 cd/A and the maximal power efficiency was 67.95 lm/W.

EXAMPLE 3

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of 1-2×10$^{-5}$ Pa, a MoO$_3$ anode modification layer 3 having a thickness of 3 nm, a TAPC hole transporting-electron blocking layer 4 having a thickness of 40 nm, a TcTa hole-dominated light-emitting layer 5 doped with PQ$_2$Ir(dpm) having a thickness of 10 nm, a 26DCzPPy electron-dominated light-emitting layer 6 co-doped with Eu(DBM)$_3$phen and PQ$_2$Ir(dpm) having a thickness of 10 nm, and a TmPyPB hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of 4-6×10$^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/PQ$_2$Ir(dpm)(4%):TcTa/Eu(DBM)$_3$phen(0.3%):PQ$_2$Ir(dpm)(4%):26DCzPPy/TmPyPB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.05 nm/s, the evaporation plating rates for PQ$_2$Ir(dpm) and TcTa in the hole-dominated light-emitting layer 5 were controlled at 0.003 nm/s and 0.05 nm/s respectively, the evaporation plating rates for Eu(DBM)$_3$phen. PQ$_2$Ir(dpm), and 26DCzPPy in the electron-dominated light-emitting layer 6 were controlled at 0.0003 nm/s, 0.004 nm/s, and 0.1 nm/s respectively, the evaporation plating rate for TmPyPB in the hole blocking-electron transporting layer 7 was controlled at 0.05 nm/s, the evaporation plating rate for LiF in the cathode modification layer 8 was controlled at 0.005 nm/s, and the evaporation plating rate for Al in the metal cathode layer 9 was controlled at 1.0 nm/s.

The properties of the red organic electroluminescent device prepared in this example were tested. It was demonstrated by experimental results that the device emitted red light at about 592 nanometers under the driving of a direct-current power supply. When the brightness was 20000 cd/m$^2$, the color coordinate of the device was (0.590, 0.381); and the color coordinate of the device was hardly changed as the operating voltage varied. The turn-on voltage of the device was 3.0 volts, and the maximal brightness of the device was 69864 cd/m$^2$. The maximal current efficiency of the device was 63.75 cd/A and the maximal power efficiency was 66.73 lm/W.

EXAMPLE 4

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1\text{-}2\times10^{-5}$ Pa, a MoO$_3$ anode modification layer 3 having a thickness of 5 nm, a TAPC hole transporting-electron blocking layer 4 having a thickness of 30 nm, a mCP hole-dominated light-emitting layer 5 doped with Ir(dmpq)$_3$(acac) having a thickness of 15 nm, a 26DCzPPy electron-dominated light-emitting layer 6 co-doped with Eu(DBM)$_3$phen and Ir(dmpq)$_3$(acac) having a thickness of 15 nm, and a 3TPYMB hole blocking-electron transporting layer 7 having a thickness of 35 nm were sequentially evaporated on the ITO layer. Next, the uncompleted device was transferred to a metal evaporation plating chamber, and a LiF cathode modification layer 8 having a thickness of 1.1 nm was evaporated under a vacuum atmosphere of $4\text{-}6\times10^{-5}$ Pa. Finally; a metal Al cathode layer 9 having a thickness of 250 nm was evaporated on the LiF layer through a specially-made mask plate to prepare an organic electroluminescent device having the structure of ITO/MoO$_3$/TAPC/Ir(dmpq)$_3$(acac)(2%):mCP/Eu(DBM)$_3$phen(0.1%):Ir(dmpq)$_3$(acac)(3%):2 6DCzPPy/3TPYMB/LiF/Al. The evaporation plating rate for MoO$_3$ in the anode modification layer 3 was controlled at 0.01 nm/s, the evaporation plating rate for TAPC in the hole transporting-electron blocking layer 4 was controlled at 0.06 nm/s, the evaporation plating rates for Ir(dmpq)$_3$(acac) and mCP in the hole-dominated light-emitting layer 5 were controlled at 0.002 nm/s and 0.1 nm/s respectively, the evaporation plating rates for Eu(DBM)$_3$phen, Ir(dmpq)$_3$(acac), and 26DCzPPy in the electron-dominated light-emitting layer 6 were controlled at 0.0001 nm/s, 0.003 nm/s, and 0.1 nm/s respectively, the evaporation plating rate for 3TPYMB in the hole blocking-electron transporting layer 7 was controlled at 0.08 nm/s, the evaporation plating rate for LiF in the cathode modification layer 8 was controlled at 0.01 nm/s, and the evaporation plating rate for Al in the metal cathode layer 9 was controlled at 0.9 nm/s.

The properties of the red organic electroluminescent device prepared in this example were tested. It was demonstrated by experimental results that the device emitted red light at about 592 nanometers under the driving of a direct-current power supply. When the brightness was 20000 cd/m$^2$, the color coordinate of the device was (0.588, 0.379); and the color coordinate of the device was hardly changed as the operating voltage varied. The turn-on voltage of the device was 3.1 volts, and the maximal brightness of the device was 64572 cd/m$^2$. The maximal current efficiency of the device was 60.11 cd/A and the maximal power efficiency was 60.89 lm/W.

EXAMPLE 5

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1\text{-}2\times10^{-5}$ Pa, a MoO$_3$ anode modification layer 3 having a thickness of 6 nm, a TAPC hole transporting-electron blocking layer 4 having a thickness of 50 nm, a TCP hole-dominated light-emitting layer 5 doped with Ir(MDQ)$_2$(acac) having a thickness of 12 nm, a UGH2 electron-dominated light-emitting layer 6 co-doped with Eu(DBM)$_3$phen and Ir(MDQ)$_2$(acac) having a thickness of 16 nm, and a BmPyPhB hole blocking-electron transporting layer 7 having a thickness of 45 nm were sequentially evaporated on the ITO layer. Next, the uncompleted device was transferred to a metal evaporation plating chamber, and a LiF cathode modification layer 8 having a thickness of 1.1 nm was evaporated under a vacuum atmosphere of $4\text{-}6\times10^{-5}$ Pa. Finally, a metal Al cathode layer 9 having a thickness of 240 nm was evaporated on the LiF layer through a specially-made mask plate to prepare an organic electroluminescent device having the structure of ITO/MoO$_3$/TAPC/Ir(MDQ)$_2$(acac)(3%):TCP/Eu(DBM)phen(0.3%):Ir(MDQ)$_2$(acac)(3%):U GH2/BmPyPhB/LiF/A. The evaporation plating rate for MoO$_3$ in the anode modification layer 3 was controlled at 0.01 nm/s, the evaporation plating rate for TAPC in the hole transporting-electron blocking layer 4 was controlled at 0.08 nm/s, the evaporation plating rates for Ir(MDQ)$_2$(acac) and TCP in the hole-dominated light-emitting layer 5 were controlled at 0.003 nm/s and 0.1 nm/s respectively, the evaporation plating rates for Eu(DBM)$_3$phen, Ir(MDQ)$_2$(acac), and UGH2 in the electron-dominated light-emitting layer 6 were controlled at 0.0003 nm/s, 0.003 nm/s, and 0.1 nm/s respectively, the evaporation plating rate for BmPyPhB in the hole blocking-electron transporting layer 7 was controlled at 0.09 nm/s, the evaporation plating rate for LiF in the cathode modification layer 8 was controlled at 0.012 nm/s, and the evaporation plating rate for Al in the metal cathode layer 9 was controlled at 1.2 nm/s.

The properties of the red organic electroluminescent device prepared in this example were tested. It was demonstrated by experimental results that the device emitted red light at about 592 nanometers under the driving of a direct-current power supply. When the brightness was 20000 cd/m$^2$, the color coordinate of the device was (0.592, 0.378); and the color coordinate of the device was hardly changed as the operating voltage varied. The turn-on voltage of the device was 3.1 volts, and the maximal brightness of the device was 60782 cd/m$^2$. The maximal current efficiency of the device was 62.34 cd/A and the maximal power efficiency was 63.14 lm/W.

EXAMPLE 6

An ITO anode layer on an ITO glass was laser-etched into a strip electrode, then ultrasonically cleaned sequentially with a cleaning liquid and deionized water for 15 min, and placed in an oven for drying. The dried substrate was then placed in a pretreated vacuum chamber, and the ITO anode was subjected to a low-pressure plasma treatment for 3 min under an atmosphere having a vacuum degree of 10 Pa with a voltage of 400V and then transferred to an organic evaporation plating chamber. In an organic evaporation plating chamber with a vacuum degree of $1\text{-}2\times10^{-5}$ Pa, a MoO$_3$ anode modification layer 3 having a thickness of 3 nm, a TAPC hole transporting-electron blocking layer 4 having a thickness of 40 nm, a BSB hole-dominated light-emitting layer 5 doped with Ir(dpm)(piq)$_2$ having a thickness of 10 nm, a BCBP electron-dominated light-emitting layer 6 co-doped with Tb(acac)$_3$phen and Ir(dpm)(piq)$_2$ having a thickness of 10 nm, and a TPBi hole blocking-electron transporting layer 7 having a thickness of 40 nm were sequentially evaporated on the ITO layer. Next, the uncompleted device was transferred to a metal evaporation plating chamber, and a LiF cathode modification layer 8 having a thickness of 1.0 nm was evaporated under a vacuum atmosphere of $4\text{-}6\times10^{-5}$ Pa. Finally, a metal Al cathode layer 9 having a thickness of 120 nm was evaporated on the LiF layer through a specially-made mask plate to prepare an organic electroluminescent device having the structure of ITO/MoO$_3$/TAPC/Ir(dpm)(piq)$_2$(4%):BSB/Eu(TTA)$_3$phen (0.3%):Ir(dpm)(piq)$_2$(4%):BCBP/TPBi/LiF/Al. The evaporation plating rate for MoO$_3$ in the anode modification layer 3 was controlled at 0.02 nm/s, the evaporation plating rate for TAPC in the hole transporting-electron blocking layer 4 was controlled at 0.08 nm/s, the evaporation plating rates for Ir(dpm)piq)$_2$ and BSB in the hole-dominated light-emitting layer 5 were controlled at 0.004 nm/s and 0.1 nm/s respectively, the evaporation plating rates for Ir(dpm)(piq)$_2$, Eu(TTA)$_3$phen, and BCBP in the electron-dominated light-emitting layer 6 were controlled at 0.004 nm/s, 0.0003 nm/s, and 0.1 nm/s respectively, the evaporation plating rate for TPBi in the hole blocking-electron transporting layer 7 was controlled at 0.08 nm/s, the evaporation plating rate for LiF in the cathode modification layer 8 was controlled at 0.005 nm/s, and the evaporation plating rate for Al in the metal cathode layer 9 was controlled at 1.5 nm/s.

The properties of the red organic electroluminescent device prepared in this example were tested. It was demonstrated by experimental results that the device emitted red light at about 592 nanometers under the driving of a direct-current power supply. When the brightness was 20000 cd/m$^2$, the color coordinate of the device was (0.592, 0.380); and the color coordinate of the device was hardly changed as the operating voltage varied. The turn-on voltage of the device was 3.0 volts, and the maximal brightness of the device was 63110 cd/m$^2$. The maximal current efficiency of the device was 61.71 cd/A and the maximal power efficiency was 64.59 lm/W.

The descriptions of the above Examples are only used to help the understanding of the method of the present disclosure and the core idea thereof. It is to be indicated that, with respect to the person skilled in the art, various improvements and modifications may also be made to this disclosure without departing from the principle of this disclosure. These improvements and modifications also fall in the protection scope of the claims of this disclosure.

The above descriptions of the disclosed Examples enable the skilled person in the art to achieve or use this disclosure. Various amendments to these Examples will be apparent to those skilled in the art. General principles defined herein may be achieved in other examples without departing from the spirit or scope of this disclosure. Therefore, this disclosure will not be limited to these examples illustrated herein, but is to comply with the widest scope consistent with the principles and novel features disclosed herein.

What is claimed is:

1. A red organic electroluminescent device, comprising:
a substrate;
an anode layer provided on the substrate;
an anode modification layer provided on the anode layer;
a hole transporting-electron blocking layer provided on the anode modification layer;
a hole-dominated light-emitting layer provided on the hole transporting-electron blocking layer;
an electron-dominated light-emitting layer provided on the hole-dominated light-emitting layer;
a hole blocking-electron transporting layer provided on the electron-dominated light-emitting layer;
a cathode modification layer provided on the hole blocking-electron transporting layer; and
a cathode layer provided on the cathode modification layer;
wherein the electron-dominated light-emitting layer is composed of an organic sensitive material, a red organic light-emitting material, and an electron-type organic host material;
the organic sensitive material is one or two selected from the group consisting of tris(dibenzoylmethane)phenanthroline europium and tris(thenoyltrifluoroacetone) phenanthroline europium; and
the organic sensitive material is 0.1 wt %-0.5 wt % of the electron-type organic host material.

2. The red organic electroluminescent device according to claim 1, wherein the content of the red organic light-emitting material is 2 wt %-5 wt % of the content of the electron-type organic host material.

3. The red organic electroluminescent device according to claim 1, wherein the red organic light-emitting material is one or more selected from the group consisting of bis(2-phenylquinoline)-(2,2,6,6-tetramethyl-3,5-heptanedionate) iridium, bis(2-benzo[b]-2-thiophenyl-pyridine)(acetylacetonate) iridium, tris(1-phenylisoquinoline) iridium, bis(1-phenylisoquinoline)(acetylacetone) iridium, bis[1-(9,9-dimethyl-9H-fluoren-2-yl)-isoquinoline](acetylacetone) iridium, bis[2-(9,9-dimethyl-9H-fluoren-2-yl)-quinoline](acetylacetone) iridium, bis(2-phenylquinoline)(2-(3-tolyl) pyridine) iridium, tris[2-phenyl-4-methylquinoline] iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl-7-methyl-quinoline](acetylacetone) iridium.

4. The red organic electroluminescent device according to claim 1, wherein the electron-type organic host material is one or more selected from the group consisting of 2,6-bis [3-(9H-9-carbazoyl)phenyl]pyridine, 1,4-bis(triphenylsilyl benzene, 2,2'-bis(4-(9-carbazoyl)phenyl)biphenyl, tris[2,4, 6-trimethyl-3-(3-pyridinyl)phenyl]borane, 1,3,5-tri[(3-pyridinyl)-3-phenyl]benzene, 1,3-bis[3,5-di(3-pyridinyl) phenyl]benzene, 1,3,5-tris(1-phenyl-1H-benzimidazol-2-yl) benzene, 9-(4-tert-butylphenyl)-3,6-bis(triphenylsilyl)-9H-carbazole, and 9-(8-diphenylphosphoryl)-dibenzo[b,d] furan-9H-carbazole.

5. The red organic electroluminescent device according to claim 1, wherein the hole-dominated light-emitting layer is composed of a red organic light-emitting material and a hole-type organic host material; and the red organic light-emitting material is 2.0 wt %-5.0 wt % of the hole-type organic host material, wherein
the red organic light-emitting material is one or more selected from the group consisting of bis(2-phenylquinoline)-(2,2,6,6-tetramethyl-3,5-heptanedionate) iridium, bis(2-benzo[b]-2-thiophenyl-pyridine)(acetylacetonate) iridium, tris(1-phenylisoquinoline) iridium, bis(1-phenylisoquinoline)(acetylacetone) iridium, bis [1-(9,9-dimethyl-9H-fluoren-2-yl)-isoquinoline] (acetylacetone) iridium, bis[2-(9,9-dimethyl-9H-fluoren-2-yl)-quinoline](acetylacetone) iridium, bis(2-phenylquinoline)(2-(3-tolyl)pyridine) iridium, tris[2-phenyl-4-methylquinoline] iridium, bis (phenylisoquinoline)(2,2,6,6-tetramethylhexane-3,5-dione) iridium, bis(2-methyldibenzo[f,h]quinoxaline) (acetylacetone) iridium, and bis[2-(2-methylphenyl)-7-methyl-quinoline](acetylacetone) iridium, and the hole-type organic host material is one or more selected from the group consisting of 4,4'-N,N'-dicarbazole-biphenyl 1,3-dicarbazol-9-ylbenzene, 9,9'(5-(triphenylsilyl)-1,3-phenyl)bis-9H-carbazole, 1,3,5-tris(9-carbazoyl)benzene, 4,4',4"-tris(carbazol-9yl)triphenylamine, and 1,4-bis(triphenylsilyl)biphenyl.

6. The red organic electroluminescent device according to claim 1, wherein the material of the hole transporting-electron blocking layer is one or more selected from the group consisting of 4,4'-cyclohexylidenebis[N,N-bis(4-methylphenyl)aniline], dipyrazino[2,3-f:2',3 '-h]quinoxaline-2,3,6,7,10,11-hexacarbonitrile, N4,N4'-di(naphthalene-1-yl)-N4,N4'-bis(4-vinylphenyl)biphenyl-4,4'-diamine, N,N'-bis(3-methylphenyl)-N,N'-bis(phenyl)-2,7-diamino-9,9-spirobifluorene, N,N,N',N'-tetra-(3-methylphenyl)-3-3'-dimethylbenzidine, 2,2'-bis(3-(N,N-di-p-tolylamino)phenyl)biphenyl, N,N'-bis(naphthalen-2-yl)-N,N'-bis(phenyl)benzidine, N,N'-bis(naphthalen-1-yl)-N,N'-diphenyl-2,7-diamino-9,9-spirobifluorene, N,N'-bis(3-methylphenyl)-N,N'-diphenyl-2,7-diamino-9,9-dimethylfluorene, N,N'-bis(naphthalenl1-yl)-N,N'-diphenyl-2,7-diamino-9,9-dimethylfluorene, N,N'-bis(3-methylphenly)-N,N'-diphenyl-2,7-diamino-9,9-diphenylfluorene, N,N'-bis(naphthalen-1-yl)-N,N'-diphenyl-2,7-diamino-9,9-diphenylfluorene, N,N'-bis(naphthalen-1-yl)-N,N'-diphenyl-2,2'-dimethylbenzidine, 2,2', 7,7'-tetrakis(N,N-diphenylamino)-2,7-diamino-9,9-spirobifluorene, 9,9-bis[4-(N,N-bis-naphthalen-2-yl-amino)phenyl]-9H-fluorene, 9,9-[4-(N-naphthalen-1ly-N-anilino)-phenyl]-9H-fluorene, 2,2'-bis[N,N-bis(4-phenyl)amino]-9,9-spirobifluorene, 2,2'-bis(N,N-phenylamino)-9,9-spirobifluorene, N,N'-diphenyl-N,N'-(1-naphthyl)-1,1'-biphenyl-4,4'-diamine, and 4,4'-bis[N-(p-tolyl)-N-phenyl-amino]diphenyl.

7. The red organic electroluminescent device according to claim 1, wherein the material of the hole blocking-electron transporting layer is one or more selected from the group consisting of tris[2,4,6-trimethyl-3-(3-pyridinyl)phenyl]borane, 1,3,5-tri[(3-pyridinyl)-3-phenyl]benzene, 1,3-bis[3,5-di(3-pyridinyl)phenyl]benzene, and 1,3,5-tris(1-phenyl-1H-benzimidazol-2-yl)benzene.

8. The red organic electroluminescent device according to claim 1, wherein the anode modification layer has a thickness of 1-10 nm, the hole transporting-electron blocking layer has a thickness of 30-60 nm, the hole-dominated light-emitting layer has a thickness of 5-20 nm, the electron-dominated light-emitting layer has a thickness of 5-20 nm, the hole blocking-electron transporting layer has a thickness of 30-60 , the cathode modification layer has a thickness of 0.8-1.2 nm, and the cathode layer has a thickness of 90-300 nm.

9. The red organic electroluminescent device according to claim 2, wherein the red organic light-emitting material is one or more selected from the group consisting of bis(2-phenylquinoline)-(2,2,6,6-tetramethyl-3,5-heptanedionate) iridium, bis(2-benzo[b]-2-thiophenyl-pyridine)(acetylacetonate) iridium tris(1-phenylisoquinoline) iridium, bis(1-phenylisoquinoline)(acetylacetone) iridium, bis[1-(9,9-dimethyl-9H-fluoren-2-yl)-isoquinoline](acetylacetone) iridium, bis[2-(9,9-dimethyl-9H-fluoren-2-yl)-quinoline](acetylacetone) iridium, bis(2-phenylquinoline)(2-(3-tolyl)pyridine) iridium, tris[2-phenyl-4-methylquinoline] iridium, bis(phenylisoquinoline)(2,2,6,6-tetramethylhexane-3,5-dione) iridium, bis(2-methyldibenzo[f,h]quinoxaline)(acetylacetone) iridium, and bis[2-(2-methylphenyl)-7-methylquinoline](acetylacetone) iridium.

10. A preparation method of a red organic electroluminescent device, comprising the steps of:
    etching an anode layer on a substrate, and after drying, evaporation plating an anode modification layer, a hole transporting-electron blocking layer, a hole-dominated light-emitting layer, an electron-dominated light-emitting layer, a hole blocking-electron transporting layer, a cathode modification layer, and a cathode layer in turn on the anode layer,
    wherein the electron-dominated light-emitting layer is composed of an organic sensitive material, a red organic light-emitting material, and an electron-type organic host material;
    the organic sensitive material is one or two selected from the group consisting of tris(dibenzoylmethane)phenanthroline europium and tris thenoyltrifluoroacetone) phenanthroline europium; and
    the organic sensitive material is 0.1 wt % -0.5 wt % of the electron-type organic host material.

11. The preparation method according to claim 10, wherein the evaporation plating rate for the anode modification layer is 0.01-0.05 nm/s; the evaporation plating rates for the hole transporting-electron blocking layer, the hole blocking-electron transporting laver, and the host materials in the hole-dominated light-emitting layer and the electron-dominated light-emitting layer are 0.05-0.1 nm/s; the evaporation plating rate for the organic sensitized material in the electron-dominated light-emitting layer is 0.00005-0.0005 nm/s; the evaporation plating rates for the red light-emitting materials in the electron-dominated light-emitting layer and the hole-dominated light-emitting layer are 0.001-0.005 nm/s; the evaporation plating rate for the cathode modification layer is 0.005-0.05 nm/s; and the evaporation plating rate for the cathode layer is 0.5-2.0 nms.

* * * * *